United States Patent
Miyasaka

[11] Patent Number: 6,017,779
[45] Date of Patent: Jan. 25, 2000

[54] FABRICATION METHOD FOR A THIN FILM SEMICONDUCTOR DEVICE, THE THIN FILM SEMICONDUCTOR DEVICE ITSELF, LIQUID CRYSTAL DISPLAY, AND ELECTRONIC DEVICE

[75] Inventor: Mitsutoshi Miyasaka, Nagano-ken, Japan

[73] Assignee: Seiko Epson Corporation, Tokyo, Japan

[21] Appl. No.: 09/023,695

[22] Filed: Feb. 13, 1998

Related U.S. Application Data

[63] Continuation of application No. 08/591,681, Feb. 15, 1996, Pat. No. 5,858,819.

[30] Foreign Application Priority Data

Jun. 15, 1994  [JP]  Japan .................................. 6-133374
Mar. 29, 1995  [JP]  Japan .................................. 7-72144

[51] Int. Cl.[7] .............................. H01L 21/00; H01L 21/20
[52] U.S. Cl. .......................... 438/149; 438/166; 438/486
[58] Field of Search ................................ 438/149, 166, 438/486

[56] References Cited

U.S. PATENT DOCUMENTS

| | | |
|---|---|---|
| 4,297,392 | 10/1981 | Higashi et al. . |
| 4,812,328 | 3/1989 | Saitoh et al. ................................ 427/69 |
| 5,114,770 | 5/1992 | Echizen et al. ............................ 427/38 |
| 5,192,717 | 3/1993 | Kawakami . |
| 5,289,030 | 2/1994 | Yamazaki . |
| 5,313,075 | 5/1994 | Zhang et al. . |
| 5,372,958 | 12/1994 | Miyasaka . |
| 5,482,749 | 1/1996 | Telford . |
| 5,488,000 | 1/1996 | Zhang . |
| 5,583,369 | 12/1996 | Yamazaki et al. ....................... 257/635 |
| 5,624,873 | 4/1997 | Fonash . |
| 5,648,276 | 7/1997 | Hara . |

FOREIGN PATENT DOCUMENTS

| | | |
|---|---|---|
| 0 254 589 A2 | 7/1987 | European Pat. Off. . |
| 0 526 779 A1 | 7/1992 | European Pat. Off. . |
| 0 552 375 A1 | 7/1992 | European Pat. Off. . |
| 0 562 623 A2 | 3/1993 | European Pat. Off. . |
| 0 592 227 A2 | 10/1993 | European Pat. Off. . |
| 0 598 394 A2 | 11/1993 | European Pat. Off. . |

(List continued on next page.)

OTHER PUBLICATIONS

Masatada Horiuchi et al, "One–Decade Reduction of PN–Junction Leakage Current Using Poly–SI Interlayered SOI Structures" Proceedings of the International Electron Devices Meeting, Wash, DC Dec. 5–8, 1993.

(List continued on next page.)

*Primary Examiner*—John F. Niebling
*Assistant Examiner*—Michael S. Lebentritt
*Attorney, Agent, or Firm*—Oliff & Berridge, PLC

[57] ABSTRACT

In order to fabricate a high performance thin film semiconductor device using a low temperature process in which it is possible to use low price glass substrates, a thin film semiconductor device has been fabricated by forming a silicon film at less than 450° C., and, after crystallization, keeping the maximum processing temperature at or below 350° C.

In applying the present invention to the fabrication of an active matrix liquid crystal display, it is possible to both easily and reliably fabricate a large, high-quality liquid crystal display. Additionally, in applying the present invention to the fabrication of other electronic circuits as well, it is possible to both easily and reliably fabricate high-quality electronic circuits.

42 Claims, 5 Drawing Sheets

FOREIGN PATENT DOCUMENTS

| | | |
|---|---|---|
| 58-164267 | 9/1983 | Japan . |
| 59-204275 | 11/1984 | Japan . |
| 63-115328 | 5/1988 | Japan . |
| 2-137797 | 5/1990 | Japan . |
| 4-7843 | 1/1992 | Japan . |
| 4-245482 | 9/1992 | Japan . |
| 5-55582 | 3/1993 | Japan . |
| 6-97079 | 4/1994 | Japan . |
| 6-132306 | 5/1994 | Japan . |
| 6-16-3401 | 8/1994 | Japan . |
| 6-232059 | 8/1994 | Japan . |
| 6-275524 | 9/1994 | Japan . |

OTHER PUBLICATIONS

Dec. 5, 1993, Institute of Electrical and Electronics Engineers, pp. 847–850, XP000481744.

Masumo K et al., "Low–Temperature Preparation of Poly–SI TFT by AR Laser Annealing at High Scanning Speed" Electronics & Communications in Japan, Part II—Electronics, vol. 76, No. 9, Sep. 1, 1993, pp. 112–116, XP000447931.

Yeckel, A. et al, "The Origin of Nonuniform Growth of LPCVD films from silane gase Mixtures" Journal of the Electrochemical Society, Jul. 1989, vol. 136, No. 7, ISSN 0013–4651.

Mitsutoshi Miyasaka et al, "Transistor and Physical Properties of Polycrystalline Silicon Films Prepared by Infralow–Pressure Chemical Vapor Deposition", Journal of Applied Physics, vol. 74, No. 4, Aug. 15, 1993, pp. 2870–2885.

Patent Abstracts of Japan, vol. 018, No. 573 (E–1624), Nov. 2, 1994 & JP 06 216004 A (NEC Corp), Aug. 5, 1994.

Ohshima, H., et al. "Full–Color LCDs with Completely Integrated Drivers Utilizing Low–Temperature Poly–SI TFTs", *SID 93 Digest* 1993, pp. 387–390.

S. Wolf, et al., Silicon Processing for the VLSI Era vol. 1, Lattice Press, 1986 (month not available).

FABRICATION METHOD FOR A THIN FILM SEMICONDUCTOR DEVICE, THE THIN FILM SEMICONDUCTOR DEVICE ITSELF, LIQUID CRYSTAL DISPLAY, AND ELECTRONIC DEVICE

This is a continuation of application Ser. No. 08/591,681 filed Feb. 15, 1996. The entire disclosure of the prior applications is hereby incorporated by reference herein in its entirety now U.S. Pat. No. 5,858,819.

FIELD OF TECHNOLOGY

The present invention is related to the fabrication method for a thin film semiconductor device, the thin film semiconductor device itself, liquid crystal displays, and electronic devices applicable to active matrix liquid crystal displays and the like.

BACKGROUND TECHNOLOGY

In recent years, along with increases in screen size and improvements in resolution, the driving methods for liquid crystal displays (LCDs) are moving from simple matrix methods to active matrix methods; and the displays are becoming capable of displaying large amounts of information. LCDs with more than several hundreds of thousands pixels are possible with active matrix methods which place a switching transistor at each pixel. Transparent insulating substrates such as fused quartz and glass which allow the fabrication of transparent displays are used as substrates for all types of LCDs. Although ordinarily semiconductor layers such as amorphous silicon or polycrystalline silicon are used as the active layer in thin film transistors (TFTs), the use of polycrystalline silicon which has higher operating speeds is advantageous for the case of producing monolithic displays which include integrated driving circuits. When polycrystalline silicon is used as the active layer, fused quartz is used as the substrate; and a so-called "high temperature" process in which the maximum processing temperature exceeds 1000° C. is used to fabricate the TFTs. On the other hand, for the case of an amorphous silicon active layer, a common glass substrate can be used. For increases in LCD display size while maintaining low costs, such use of low-cost common glass substrates is indispensable. Such amorphous silicon layers, however, have such problems as electrical characteristics far inferior to those of polysilicon layers and slow operating speed. Since the high temperature process polysilicon TFTs use quartz substrates, however, there are problems with increasing display size and decreasing costs. Consequently, there is a strong need for technology which can fabricate a thin film semiconductor device employing a semiconductor layer such as polycrystalline silicon as the active layer upon a common glass substrate. But, when using large substrates which are well-suited to mass production, there is a severe restriction in that the substrates must be kept below a maximum processing temperature of about 570° C. in order to avoid deformation of the substrates. In other words, technology which can produce, under such restrictions, the active layer of thin film transistors capable of controlling a liquid crystal display and of thin film transistors which can operate driving circuits at high speed is desired. These devices are currently known as the present low temperature poly—Si TFTs.

Previous low temperature poly—Si TFTs are shown on p. 387 of the SID (Society for Information Display) '93 Digest (1993). According to this description, 50 nm of amorphous silicon (a—Si) is first deposited at 550° C. by LPCVD using monosilane (SiH) as the source gas and then converted from a—Si to poly—Si by laser irradiation. After patterning of the poly—Si layer, a gate insulator layer of $SiO_2$ is deposited by ECR-PECVD at a substrate temperature of 100° C. Following formation of the tantalum (Ta) gate electrode on top of the gate insulator layer, self-aligned transistor source and drain regions are formed in the silicon layer by ion implantation of donor or acceptor impurities while using the gate electrode as a mask. This ion implantation, known as "ion doping", is accomplished by a non-mass separating ion implanter. Hydrogen-diluted phosphine ($PH_3$), diborane ($B_2H_6$) or similar gas is used as a source gas for ion doping. Activation of the impurities is carried out at 300° C. Following deposition of an interlevel insulator layer, electrodes and interconnects such as indium tin oxide (ITO) and aluminum (Al) are deposited to complete the thin film semiconductor device.

As described below, however, there are several inherent problems with poly—Si TFTs fabricated by the existing technology in the low temperature process which act as impediments to the adoption of this technology into mass production.

1. The high processing temperature of 550° C. prevents the use of low-priced glass leading to a steep rise in product prices. Additionally, the degree of warp of the glass substrates as a result of their own weight increases as substrate size increases, and increases in liquid crystal display (LCD) sizes are not possible.

2. The appropriate irradiation conditions necessary to obtain uniform laser irradiation over the entire substrate are severe and fall within a narrow range. As a result, the crystallization of the film can vary from uniform to non-uniform from lot to lot and reliable production is not possible.

3. During the ion doping or subsequent low temperature activation at 300–350° C. of the source and drain regions which are self-aligned with respect to the gate electrode, the problem of unsuccessful activation occasionally occurs. In other words, the resistance of the source and drain regions is several gigaohms. Especially when producing TFTs with lightly doped drains (LDD), this problem is serious and is a cause of significant decreases in production yield.

4. Although only $SiO_2$ formed by ECR-PECVD yields suitable transistor properties-in low temperature process poly—Si TFTs, it is difficult to increase the size of the ECR source in the ECR-PECVD equipment thereby making ECR-PECVD unsuitable for large LCD panels. Furthermore, the throughput is extremely poor. Consequently, ECR-PECVD reactors are not suitable as mass production-compatible, practical gate oxide film deposition equipment applicable to the manufacture of large size displays.

5. Use of means such as laser irradiation for melt crystallization of semiconductor films like silicon results in partial agglomeration which can lead to large variations in the electrical properties of the semiconductor layer, roughness of the semiconductor layer, and decreases in the gate-source or gate-drain electrical breakdown strength.

6. When low cost, conventional glass substrates were used, the underlevel protection layer necessary to effectively prevent penetration of impurities from the glass into the semiconductor layer was not the underlevel protection layer of the semiconductor devices which showed the optimum electrical properties. In other words, making the underlevel protection layer thicker to prevent impurity penetration leads to the deterioration of the electrical properties of the semiconductor device from stress generated by the underlayer or generates cracks in the semiconductor device.

7. When plasma enhanced chemical vapor deposition (PECVD) is used to produce the semiconductor films, elements such as fluorine (F) and carbon (C), constitutive elements of vapors used in cleaning the deposition chamber which may remain after cleaning, may be incorporated as impurities into the films. The result is that the amount of impurities incorporated into the substrates varies, and it is not possible to reliably produce excellent thin film semiconductor devices.

8. As the deposition temperature for semiconductor films in low pressure chemical vapor deposition (LPVCD) decreases, compatibility between uniformity within a substrate and the deposition rate is difficult. In other words, because the deposition rate decreases when the deposition temperature is lowered, the increase in pressure necessary to compensate for this behavior results in significant worsening of the uniformity over a single substrate. This tendency becomes noticeably more pronounced as the substrate size becomes larger and is a major obstacle to the mass production of large LCDs.

9. There are three types of non-uniformity of the electrical characteristics of thin film semiconductor devices. In addition to variations within a single substrate, there are also variations from substrate to substrate in a single lot as well as variations between different lots. In the thin film semiconductor devices and the fabrication procedures of the existing technology, it is not possible to control these three types of non-uniformity. In particular, there has been almost no thought given to the variation in properties seen from lot to lot.

10. In the fabrication of semiconductor thin films by PECVD, the adhesion between the semiconductor layer and the protective underlayer is poor; and numerous crater-shaped holes are generated in the semiconductor layer which can lead to delamination of the film in the worst case.

The present invention aims to solve the problems noted above with the purpose of providing a means for reliably producing good thin film semiconductor devices through a realistically convenient method using a processing temperature which will allow the use of common large glass substrates.

DESCRIPTION OF THE INVENTION

The fundamental principles and operation of the present invention will be explained with reference to the drawings.

FIGS. 1(a) through (d) are cross-sectional schematic representations of the fabrication process for thin film semiconductor devices constituting an MIS field effect transistor. After giving an outline of the low temperature poly—Si TFT fabrication process using these figures, the details of the present invention will be explained for each processing step.
1, Outline of the Fabrication Procedure of a Thin Film Semiconductor Device of the Present Invention In the present invention, a conventional non-alkaline glass is used as an example for substrate 101. First, an insulating underlevel protection layer 102 is formed on top of substrate 101 by a technique such as atmospheric pressure chemical vapor deposition (APCVD), PECVD, or sputtering. Next, a semiconductor layer such as intrinsic silicon, which will later become the active layer of the semiconductor device, is deposited. The semiconductor layer can be formed by chemical vapor deposition (CVD) such as LPCVD, PECVD, or APCVD or by physical vapor deposition (PVD) such as sputtering or evaporation. Crystallization of the semiconductor layer so fabricated is achieved by short-time irradiation using electromagnetic energy or optical energy such as from laser light. When the originally deposited semiconductor layer is amorphous or a mixture of amorphous and microcrystalline material, this process is known as crystallization. On the other hand, if the originally deposited semiconductor layer is polycrystalline, the process is known as recrystallization. In this description of the present invention, both are simply referred to as "crystallization" unless it is necessary to make a distinction. If the intensity of the energy from laser light or other source is high, the semiconductor layer will crystallize by initially melting and then solidifying upon cooling. This is known as melt crystallization in the present invention. Conversely, crystallization in which the semiconductor layer does not melt but proceeds in the solid state is known as solid phase crystallization (SPC). Solid phase crystallization can be divided mainly into three types: furnace-SPC in which crystallization occurs at temperatures from 550° C. to 650° C. for times ranging from a few hours to several tens of hours, rapid thermal annealing (RTA) in which crystallization occurs in a very short time frame ranging from less than one second up to about one minute at temperatures of 700 to 1000° C., and very short time-SPC (VST-SPC) using low intensity energy such as from a laser. Although all three types are suitable for use in the present invention, melt crystallization, RTA and VST-SPC are particularly appropriate when considered in light of processing which allows high productivity for large substrates. The reason for this is not only that these crystallization methods use extremely short irradiation periods but also that the whole substrate is not heated during crystallization of the semiconductor layer since the irradiated area is localized with respect to the entire substrate area; and, therefore, no heat-induced deformation or cracking of the substrate occurs. Following crystallization, the semiconductor layer is patterned; and then the active semiconductor layer 103 is produced. See FIG. 1(a).

After formation of the semiconductor layer, the gate insulator layer 104 is formed by a method such as CVD or PVD. Several methods can be considered for the fabrication of insulating films, but a fabrication temperature of 350° C. or less is desirable. This is essential to avoid thermal degradation of the MOS interface and the insulating film. This is applicable to subsequent steps in the fabrication process as well. Processing temperatures following fabrication of the gate insulator layer must be kept at or below 350° C. Doing so allows high performance semiconductor devices to be produced both easily and reliably.

Next, a thin film which will become the gate electrode 105 is deposited by a method such as PVD or CVD. Since the same material is usually used for both the gate electrode and the gate interconnects and both are fabricated in the same step, it is desirable to use a material which has low electrical resistance and is stable with respect to thermal processing around 350° C. After patterning of the thin film for the gate electrode, ion incorporation 106 into the semiconductor layer is employed to form the source and drain regions 107 and the channel region 108. See FIG. 1(c). During this process, the gate electrode acts as a mask for ion implantation so that the channel is formed only underneath the gate in a self-aligned structure. For impurity ion incorporation, both ion doping, in which non-mass separation equipment is used and hydrogenated impurity species as well as hydrogen are incorporated into the film, and ion implantation, in which mass-separation ion implanters are used and only the desired impurities themselves are incorporated into the film, are applicable. Source gases for ion doping use hydrogenated species of the impurity ions such as phosphine ($PH_3$) and diborane ($B_2H_6$) which are diluted in hydrogen to concentrations of 0.1% to 10%. In the case of ion implantation, hydrogen ions (protons or molecular hydrogen ions) are implanted following the implantation of the desired impurity elements by themselves. In order to maintain a stable MOS interface and gate insulator layer, the temperature must be kept at or below 350° C. for both ion doping and ion implantation. In order to always reliably carry out the impurity activation at a low temperature of 350° C. or less, it is desirable to keep the substrate temperature above 200° C. during implantation. On the other hand, to ensure a low temperature activation of impurity ions implanted in the channel to control the transistor threshold voltage or impurity ions implanted in lightly doped regions such as those used to form an LDD structure, it is necessary to keep the substrate temperature at or above 250° C. during ion implantation. The result is that amorphization of the ion implanted region can be avoided by performing the ion implantation at a such a high substrate temperature since recrystallization occurs simultaneously with damage to the semiconductor layer. In other words, the ion implanted region remains crystalline following implantation, and the subsequent activation of the implanted ions can still be achieved using a low activation annealing temperature of less than about 350° C. When fabricating a CMOS TFT, the NMOS or PMOS region is alternately covered by a suitable mask material such as polyimide resin, and ion implantation is performed using the procedure above. If the substrate temperature is kept below approximately 300° C. during ion implantation, it is possible to use a cheap, easily preserved conventional photoresist as an ion implantation mask instead of the polyimide.

Next, the interlevel insulator film 109 is formed by either CVD or PVD. Following ion implantation and interlevel insulator film formation, ion activation and interlevel insulator film densification are carried out by thermal annealing in a suitable thermal environment at temperatures less than about 350° C. for a time ranging from several tens of minutes to a few hours. It is desirable for this annealing temperature to be greater than approximately 250° C. to ensure activation of the implanted ions. Additionally, for effective densification of the interlevel insulator film, a temperature of 300° C. or higher is preferred. The film quality of the gate insulator layer and the interlevel insulator layer are normally different. Accordingly, during the opening of contact holes in the two insulator films following interlevel insulator film formation, it is common for the etching rates in the two films to be different. Under such conditions, an inverse taper in which the bottom of the contact hole is wider than the top or the formation of a canopy can result. During electrode formation, these undesirable structures can be causes of poor contact between the electrode and underlying layers in the device leading to so-called "contact failure." The generation of contact failure can be minimized by effective densification of the interlevel insulator film. Following formation of the interlevel insulator layer, contact holes are opened above the source and drain regions; and source and drain electrodes 110 and interconnects are formed by PVD or CVD to complete the fabrication of the thin film semiconductor device.. See FIG. 1(d).

2, Detailed Explanations of the Individual Steps in the Fabrication Process of the Thin Film Semiconductor Device of the Present Invention 2-1, Substrates and Underlevel Protection Layers Suitable for the Present Invention First, substrates and underlevel protection layers suitable for the present invention will be explained. For the present invention, substrates including conductive materials such as metals; ceramic materials such as silicon carbide (Sic), alumina ($Al_2O_3$), and aluminum nitride (AIN); transparent insulating materials such as fused quartz and glass; semiconductor substrates such as silicon wafers or processed LSI; and crystalline insulators such as sapphire (trigonal $Al_2O_3$) can be used. Low priced conventional glass substrates which can be used include Corning Japan's 7059 and 1737 glasses, Nippon Electric Glass Co., Ltd.'s OA-2 glass, and NH Techno Glass's NA35. The type of substrate is immaterial for the semiconductor film; and, as long as least part of the substrate surface is composed of an insulating material, the semiconductor layer can be deposited on top of the insulating material. This insulating material is known as the underlevel protection layer in the present invention disclosure. For example, if a fused quartz substrate is used as a substrate, it is acceptable to deposit a semiconductor film directly on top of the fused quartz substrate since the substrate itself is insulating. Or, it is acceptable to deposit the semiconductor film on top of an underlevel protection layer such as silicon oxide ($SiO_x$: $0<x\leq2$) or silicon nitride ($Si_3N_x$: $0<x\leq4$) which has been formed on top of the quartz substrate. When using an ordinary glass substrate, it is possible to deposit the semiconductor film directly on top of the insulating glass, but it is desirable to deposit the semiconductor film after the formation of an insulating underlevel protection layer such as silicon oxide or silicon nitride to avoid penetration of mobile ions like sodium (Na), which are contained in the glass substrate, into the semiconductor film. By so doing, the operational properties of the semiconductor device do not vary under operation over a long time period or under high voltages, and the stability is increased. In the present invention, this stability is called transistor reliability. With the exception of using crystalline insulating materials such as sapphire as substrates, it is desirable to deposit the semiconductor film on top of an underlevel protection layer. When using any type of ceramics as a substrate, the underlevel protection layer serves to prevent sintering aids added to the ceramics from diffusing into the semiconductor regions. In the case of metallic substrates, the use of an underlevel protection layer is essential to maintain the insulating properties. Further, with semiconductor substrates or LSI elements, interlevel insulator films between transistors or between interconnects serve the role of underlevel protection layers. The substrate size and shape adds no additional restrictions as long as the substrates do not shrink or distort in the thermal environment during processing. Substrates can be anywhere on the order of 3 inch diameter (76.2 mm) disks to 560 mm×720 mm rectangular plates.

After the substrate has been cleaned in deionized water, an underlevel protection layer of an oxide such as silicon oxide, aluminum oxide, or tantalum oxide; or a nitride such as silicon nitride is formed on the substrate by CVD methods such as APCVD, LPCVD, or PECVD; or by PVD methods. Oxides and nitrides can be formed by initially forming a metallic layer such as silicon, aluminum, or tantalum on the substrate and then using a thermochemical or electrochemical reaction. For example, it is possible to form an approximately 200 nm thermal tantalum oxide film by first sputtering about 100 nm of tantalum and then heating in an oxidizing atmosphere at about 450° C. to achieve thermal oxidation. Using APCVD, it is possible to deposit a silicon oxide film using monosilane ($SiH_4$) and oxygen as source gases at a substrate temperature of about 250 to 450° C.

PECVD and sputtering can form underlevel protection layers using substrate temperatures between room temperature and approximately 400° C.

In the present invention, because the semiconductor layer formed on top of the underlevel protection layer functions as the active layer for the transistor and this semiconductor layer is formed by crystallization, the properties of the underlevel protection layer have a strong influence on the quality of the semiconductor layer. First, it is desirable to have the center line mean surface roughness of the underlevel protection layer be 3.0 nm or less. When a semiconductor film such as silicon is deposited by CVD on top of an underlevel protection layer, the very first stage in film formation is the generation of many nuclei on top of the substrate. While these nuclei gradually grow, new nuclei form at sites on the underlevel protection layer which are not yet populated by nuclei. All of these nuclei grow, impinge on each other, and eventually link to form a film. Regardless of whether the film is amorphous or crystalline, all deposited films, having their origin in such growth mechanisms, are constructed from regions corresponding to nuclei in the early stages of growth. Consequently, if the nuclei density is low, the regions constituting the film will become large. If the regions in the semiconductor film prior to crystallization are large, the grains constituting the crystallized film will also be large. When the grains in the semiconductor film are large, the electrical properties, such as mobility, of the semiconductor device having an active layer comprised of these grains improve. According to the experiments of the inventor, it has become clear that the nuclei density can be kept low if the center line mean surface roughness is about 3.0 nm or less with the result being the ability to fabricate high performance semiconductor devices. The reason for this seems to be that the irregularity in the surface of the underlevel protection layer is one factor in nucleation, and the nucleation density increases as the surface irregularity becomes more pronounced. Further, it is desirable to have the center line mean surface roughness of the underlevel protection layer be about 1.5 nm or less when the semiconductor layer is melt crystallized. If the surface is this smooth, the melted semiconductor material such as silicon spreads readily over the underlevel protection layer. Because of this, large diameter grains can grow easily; and the properties of the thin film semiconductor device are improved dramatically. At the same time, local agglomeration of the molten material during solidification of the melted semiconductor material does not occur; and the uniformity within the molten region increases. The LSI scaling law applies to thin film semiconductor devices as well; and it appears that the miniaturization of elements will continue in step with future integration. As transistor sizes continue to shrink from the 1 $\mu$m order to submicron order, how to avoid local agglomeration will be an important issue. When fabricating the semiconductor layer by melt crystallization, the center line mean surface roughness of the underlevel protection layer is ideally 1.0 nm or less. By meeting this criterion, it is possible to produce uniform films, without local agglomeration, from semiconductor films with large-diameter grains.

Another role of the underlevel protection layer is to prevent the diffusion of impurity elements from the substrate. To do so, it is effective to combine at least two or more different types of films in a layered structure to act as the underlevel protection layer. For example, a layered structure comprising, from the substrate, a tantalum oxide film, a silicon nitride film, and a silicon oxide film can be used. There are various types of impurity elements in normal substrates, and these elements have different diffusion coefficients in the different insulators mentioned above. It is easily possible to have a certain impurity element which diffuses slowly through one of the layers comprising the underlevel protection layer but diffuses quickly through another layer. There are various impurity elements contained within substrates; and, since there is a fixed underlevel protection layer thickness as will be explained later, underlevel protection layers formed by layering of different layers are more effective in preventing the diffusion of impurities than single layers. Many different materials can be considered for the underlevel protection layer; but, from the viewpoint of ease of fabrication by processes such as CVD, composite layers of silicon nitride and silicon oxide are the most appropriate. In such two-layer composite or multilayer composite underlevel protection layers, it is desirable to have the upper most layer be of silicon oxide. This is because the interface states which are inevitably generated between the underlevel protection layer and the semiconductor layer are minimized using silicon oxide. Especially for thin semiconductor films less than a few hundred nm in which the depletion layer formed under the transistor operating conditions can consume the entire semiconductor layer thickness, it is essential to suppress such interface states. In the present invention, the optimum semiconductor film thickness for the thin film semiconductor device varies slightly depending on the fabrication process but is less than approximately 150 nm. Nevertheless, because the quality of the semiconductor film is high, there are few grain boundary trapping states-and few intragranular defects. On account of this, the depletion layer extends completely through the semiconductor film when the transistor is in operation. If there are many interface states generated at the interface between the underlevel protection layer and the semiconductor layer, the spread of the depletion layer during channel formation is delayed, leading to a high threshold voltage since the interface states effectively act the same as donor and acceptor ions. In other words, these interface states can become one factor in the degradation of transistor properties. The effect of the surface of the underlevel protection layer on transistor properties appears when the semiconductor layer is less than approximately 150 nm thick, and when the effective doping concentration in the channel layer {[(acceptor ion concentration)−(donor ion concentration)+ (concentration of trapping states and crystal defects acting as acceptor ions)] for the case of NMOS; [(donor ion concentration)−(acceptor ion concentration)+(concentration of trapping states and crystal defects acting as donor ions)] for the case of PMOS} is less than about $1\times10^{18}$ cm$^{-3}$, or when the threshold voltage of the thin film semiconductor device is less than approximately 4.5 V. To restore the properties of transistors satisfying these conditions, it is imperative to control the surface of the underlevel insulator layer; and one way to do this is to use silicon oxide as the top layer in a mutilayer underlevel protection layer composite.

It is necessary to have a sufficiently thick underlevel protection layer to prevent the diffusion of impurity ions from the substrate into the semiconductor device, and this thickness is on the order of 100 nm as a minimum. Considering variations from lot to lot or from wafer to wafer within a single lot, it is better to have a thickness greater than 200 nm; and, if the thickness is 300 nm, the film can function sufficiently as a protection layer. When the underlevel protection layer also serves as an interlevel insulator layer between IC elements or the interconnects connecting such elements, a thickness of from 400 to 600 nm is common. Since too thick of an insulating layer is a cause of stress which can lead to cracking, however, a maximum thickness of about 2 μm is preferable. Consideration of throughput, however, reduces the maximum thickness to 1 μm. For the case mentioned previously of a composite interlevel protection layer comprising a bottom layer of silicon nitride and a top layer of silicon oxide, the same relations hold; and it is necessary to have a total thickness of 100 nm with each layer 50 nm thick. In the thin film semiconductor device of the present invention, the gate insulator layer is formed by CVD or PVD at a temperature below about 350° C. To obtain a clean MOS interface for this process, the native oxide layer on the semiconductor layer surface is removed immediately prior to gate oxide film formation. This native oxide removal step does not remove only the native oxide on the surface of the semiconductor layer, but also unfortunately removes part of the exposed underlevel silicon oxide layer surface not covered by the semiconductor layer. Even after the native oxide removal step, there must be 100 nm or more of the underlevel protection layer silicon oxide for the layer to function properly. In other words, the minimum thickness of the silicon oxide layer is about 100 nm, and the minimum thickness of the silicon nitride is about 50 nm. For a thickness of less than 50 nm, the film islands do not link to form a complete film leaving gaps sporadically throughout the film. Since an underlevel protection layer loses its ability to prevent diffusive impurity penetration, it is necessary to have a minimum film thickness of 50 nm even when several films are used. As mentioned previously, the upper limit on the thickness of silicon nitride and silicon oxide films is 2 μm. Because an underlevel protection layer film thickness of 300 nm is sufficient and thicker films actually are stressed leading to cracking or degradation of transistor properties, the ideal upper limit is approximately 500 nm. When several layers are combined in a composite layered structure, the stress conditions from each film are different; and if the thicknesses of all films are kept below about 500 nm, there should be no problems.

In general, silicon oxide films deposited by CVD or PVD at temperatures less than about 350° C. have high internal stress. It is common to relieve a portion of such stress by high temperature thermal annealing following deposition. In the low temperature process of the present invention, however, the maximum processing temperature must be kept below about 350° C. following gate insulator formation. Since it is difficult to relieve stress in a silicon oxide film subjected to only such a low temperature anneal, silicon oxide films thicker than about 2 μm can lead to cracks in the substrate. Additionally, along with increases in substrate size such as those greater than 300 mm×300 mm, it becomes easier for stresses to accumulate and induce cracking in the substrate. The conditions are the same regardless of whether the silicon oxide film is a single layer or a composite structure, and cracks are generated if the total silicon oxide film thickness is 2 μm or more. In the thin film semiconductor device of the present invention, an underlevel protection layer of an insulating material is deposited on a portion of the substrate; and this is followed by fabrication of a field effect transistor, comprising a semiconductor layer, gate insulator, and gate electrode, on top of the underlevel protection layer. This is then followed by formation of an interlevel insulator layer between the interconnects of the field effect transistor to achieve electrical isolation. In addition to at least the upper-most layer of the underlevel protection layer being of silicon oxide, so is the MOS interface part of the gate insulator; and it is normal to also use silicon oxide in at least a portion of the interlevel insulator layer. Consequently, if the sum of the thicknesses of these three types of silicon oxide is less than 2 μm, formation of a thin film semiconductor device by the low temperature process on large substrates is possible without inducing cracking. Of course, it is possible to effectively prevent the generation of cracks if the sum of the thicknesses of the underlevel protection layer, the gate insulator layer, and the interlevel insulator layer is less than 2 μm.

As was explained previously in the reason for preferring the top layer of the underlevel insulator layer to be of silicon oxide, when using a high-quality semiconductor film for the active layer such as in the thin film semiconductor device of the present invention, control of the interface between the semiconductor layer and the underlevel protection layer is important. Particularly when forming the semiconductor layer using melt crystallization, it is desirable to have the surface of the underlevel protection layer be as clean as possible. If the underlevel protection layer surface is clean, this not only reduces the number of interface states between the semiconductor layer and the underlevel protection layer, but also prevents particulate or other contaminants from being incorporated into the semiconductor layer during the melt crystallization step. Therefore, it is beneficial if the underlevel protection layer and the semiconductor layer can be formed sequentially in the same piece of equipment. If the underlevel protection layer is silicon nitride, silicon oxide or a double layer of both, and the semiconductor layer is a silicon or silicon germanium film, it is possible to sequentially form such layers using a single PECVD reactor. If the mass production of thin film semiconductor devices is considered, the deposition chamber for these films are periodically cleaned; and it is necessary to remove the films which have adhered inside the PECVD deposition chamber. If cleaning is not carried out and the films continue to adhere, the films may eventually peel off and fall or lead to generation of abnormal microparticles which result in significant decreases in production yield. On the other hand, however, during the cleaning step to remove deposited thin films from the deposition chamber, trace amounts of constituent elements from the cleaning vapors such as fluorine (F) and carbon (C) are sure to be left behind in the deposition chamber. Under these conditions, the trace elements can be incorporated as impurities into the semiconductor film during the deposition process and cause degradation of the transistor properties. Additionally, if the cleaning process is repeated after a set number of substrates have been processed, the amount of impurities incorporated into substrates just after the cleaning step will be large while the amount incorporated into substrates just before the cleaning step will be small. Put another way, the amount of impurities incorporated will differ from substrate to substrate; and it will not be possible to reliably produce excellent thin film semiconductor devices. Consequently, in the present invention, the cleaning process is performed as part of the sequential deposition of the films described earlier. In other words, the cleaning process is included with the film deposition process for each substrate. As the first step, prior to placing the substrate in the PECVD reactor, the deposition chamber is cleaned of any films which were deposited during processing of the previous substrate. Specifically, cleaning gases such as $NF_3$, $CF_4$, $CHF_3$, $CR_2F_2$, and $CH_3F$ are introduced into the deposition chamber separately, or in combination with such reaction-controlling gases as oxygen ($O_2$), hydrogen ($H_2$), or ammonia ($NH_3$); or, as need be, with such inert gases as helium (He), argon (Ar), or nitrogen ($N_2$); and a plasma is initiated. Thin films deposited in the deposition chamber are removed in this step. Following completion of this cleaning procedure, a vacuum is pulled on the chamber to remove as much of the remaining gas vapors as possible. Next, in step two, a silicon nitride or silicon oxide passivation layer for the remaining impurity elements is deposited. The impurity elements, in other words, are sealed in by the passivation layer. As for the case of the underlevel protection layer, a passivation layer of more than 100 nm will effectively prevent the penetration of the impurities. It is necessary to completely remove this passivation layer after the processing of each substrate. Therefore, since making the film too thick will slow down the manufacturing process by increasing both the time for removal in step one and the time for deposition in step two, the upper limit for the passivation film thickness is approximately 1 μm. When silicon nitride is used as the passivation film, ammonia ($NH_3$) and silane ($SiH_4$, $Si_2H_6$, etc.) are used as source gases. For silicon oxide passivation layers, nitrous oxide ($N_2O$) and silane are used. Following placement of the substrate in the deposition chamber in step three, the underlevel protection layer is grown on the substrate in step four. The deposited layer functions as the underlevel protection layer on top of the substrate but functions as a second passivation layer on areas in the deposition chamber away from the substrate. Because the underlevel protection layer by itself is able to prevent the diffusion of impurities within the underlevel layer, when combined with the passivation layer deposited in step two, it is able to almost completely prevent the incorporation of impurities into the semiconductor layer. Following step four, the semiconductor layer is grown in step five without breaking vacuum; and the processing of a single substrate is completed with removal of the substrate from the deposition chamber in step six. The same procedure is repeated for each subsequent substrate. By following this substrate processing procedure and sequentially depositing the underlevel protection layer and the semiconductor layer, it is possible to keep the interface between the underlevel protection layer and the semiconductor clean and fabricate excellent thin film semiconductor devices. Further, it is possible to keep the amount of impurities such as fluorine and carbon incorporated in the semiconductor layer to a minimum. Even if there are minute amounts within the films, since it is possible to always keep the amount constant, the result is the ability to reliably produce excellent thin film semiconductor devices in a high productivity process.

2-2, Semiconductor Films in the Present Invention and the Source Gases used to Grow Them In the present invention, semiconductor films are deposited on some type of substrates. This is a feature common to all the following inventions. In addition to being applicable to single element films such as silicon (Si) and germanium (Ge), the following types of semiconductor films are also possible: group IV compound semiconductor films such as silicon germanium ($Si_xGe_{1-x}$: 0<x<1), silicon carbide ($Si_xC_{1-x}$: 0<x<1), and germanium carbide ($Ge_xC_{1-x}$: 0<x<1); III–V compound semiconductor films such as gallium arsenide (Gabs), and indium antimonide (InSb); II–VI compound semiconductor films such as cadmium selenide (CdSe). The present invention is also applicable to higher compound semiconductor films such as silicon germanium gallium arsenide ($Si_xGe_yGa_zAs_z$: x+y+z=1) as well as N-type semiconductor films in which donor elements such as phosphorous (P), arsenic (As), or antimony (Sb) have been added and P-type semiconductors in which acceptor elements such as boron (B), aluminum (Al), gallium (Ga), and indium (In) have been added.

When semiconductor films are deposited by CVD in the present invention, the films are deposited using as source gases chemical species containing the constitutive elements of the films. For example, when the semiconductor film is silicon (Si), a silane such as monosilane ($SiH_4$), disilane ($Si_2H_6$), trisilane ($Si_3H_8$), or dichlorosilane ($SiH_2Cl_2$) is used as a source gas. In the present invention disclosure, disilane and trisilane are called higher silanes ($Si_nH_{2n+2}$: n is an integer greater than or equal to 2). If germanium (Ge) is the semiconductor film, germane ($GeH_4$) is used; and phosphine ($PH_3$) and diborane ($B_2H_6$) can be used in addition if phosphorous (P) or boron (B) are to be added to the semiconductor film. Although chemical species containing the constitutive elements of the various types of films mentioned above can be used as source gases, it is preferable to use hydrogenated species of the constitutive elements since some of the source gases will always be incorporated into the semiconductor film. For example, silicon films grown from dichlorosilane ($SiH_2Cl_2$) will always contain some chlorine (Cl) whether in small or large amounts; and this incorporated Cl can lead to the degradation of transistor properties when the silicon film is used as the active layer in a thin film semiconductor device. Therefore, monosilane ($SiH_4$), a hydrogenated form of the constituent element, is preferable over dichlorosilane. As high a purity as possible for the source gases, and dilution gases if need be, is desirable. Considering that costs increase as the technological difficulties in producing high purity gases grow, a purity of 99.9999% or higher is desirable. The background pressure of common semiconductor film deposition equipment is on the order of $10^{-6}$ torr, and the process pressure is from 0.1 torr to a few torr. Therefore, the ratio of the incorporation of impurities from the background pressure in the film growth step is on the order of $10^{-5}$ to $10^{-6}$. The purity of the source or dilution gases is sufficient if it is equivalent to the ratio of the process pressure to the background pressure of the equipment using the gases. As a result, a purity of 99.999% or more (impurity ratio of $1 \times 10^{-5}$ or less) for gases flowing in the deposition equipment is desirable in the present invention. If the purity is 99.9999% (impurity ratio of $1 \times 10^{-6}$ or less), there is absolutely no problem for use as a source gas; and, in the ideal case in which the purity is ten-times that of the ratio of the background pressure to the process pressure (99.99999% in the present example; impurity ratio of $1 \times 10^{-7}$ or less), the incorporation of impurities from the gases need not even be considered.

2-3, LPCVD Reactor used in the Present Invention

The LPCVD reactor used in the present invention to deposit semiconductor films by the LPCVD process will be explained. The LPCVD reactor can be either of the vertical or horizontal furnace type. Generally, the deposition chamber is made of quartz or like material, and the substrates are placed near the center region of the deposition chamber. The outside of the deposition chamber is divided into multiple zones with heaters located in each zone. A uniform thermal region is created at the desired temperature in the region around the center portion of the reaction chamber by using these heaters which can be independently controlled. This is a so-called hot wall LPCVD reactor. By independently controlling the individual heaters, it is possible to keep the temperature variation within the uniform thermal region to within 0.2° C. Even though this temperature variation is very slight, it is always present, and is the leading cause of variations in film thickness. Additionally, since film thickness uniformity over one substrate is given preference over film thickness from substrate to substrate, it is desirable to set the substrates parallel with respect to the radial heating direction of the heaters. For example, for a vertical furnace LPCVD reactor, the semiconductor film thickness is more uniform when the substrates are placed approximately horizontal as opposed to when they are placed vertically. Conversely, for a horizontal reactor, it is better to place the substrates approximately vertically. The source gases such as silane ($SiH_4$), disilane ($Si_2H_6$), or germane ($GeH_4$) and, when need be, dilution gases such as helium, nitrogen, argon, and hydrogen enter the deposition chamber from a gas introduction port set up in a given direction. After depositing a semiconductor layer on the multiple substrates set in the central region of the deposition chamber as well as on the side walls of the deposition chamber, the gases are exhausted from a location opposite to that of the entrance port. The gases are pumped through a gate valve or a conductance valve by a pumping system which may consist of a turbomolecular pump and a rotary pump, for example. In the present invention, the pumping system consists of a turbomolecular pump and a rotary pump; but combinations with mechanical booster pumps or dry pumps are also acceptable. Regardless of whether the reactor is vertical or horizontal, it is relatively simple to achieve uniformity of the semiconductor film by basically aligning the direction of gas flow in the deposition chamber with the direction normal to the substrates set in the deposition chamber. In other words, in the case of a vertical reactor, it is preferable to have vertical gas flow since the substrates are placed approximately horizontally as mentioned previously. In a similar fashion, it is preferable to have horizontal gas flow in a horizontal reactor because the substrates are placed vertically. The LPCVD reactor used in the present invention is a high vacuum reactor with a background pressure in the $10^{-7}$ torr range. Consequently, it is possible to pump the inevitable outgassing from the substrates and substrate boat at a sufficient rate. The outgassing impurity species from the substrate and boat, which include water and oxygen among others, are impediments to the growth of good semiconductor films. These outgassing impurities from the substrates and boat can become nuclei for the deposited film during the initial stages of deposition of a silicon or other type of semiconductor film. If the outgassing is not exhausted sufficiently, there will be a large amount of adsorbed impurity gases on the substrate surface leading to the generation of many nuclei. Even when the semiconductor film is crystallized by thermal annealing or laser irradiation following deposition, the presence of the many nuclei resulting from the outgassing will result in the average grain size of the crystallized film being small and cause a degradation in the transistor properties. Additionally, the trapping of outgassing impurities in the semiconductor film during growth leads to further decline in transistor properties. As explained in section (2-1), the film quality and surface roughness of the underlevel protection layer play an important role in suppressing the generation of nuclei. At the same time, the deposition conditions of the semiconductor film must also be carefully controlled. Consequently, in addition to the regulation of the surface of the underlevel protection layer in order to minimize the generation of nuclei, the use of an LPCVD reactor which can sufficiently pump the unavoidable outgassing from the substrates and the surrounding surfaces is indispensable.

In LPCVD, semiconductor films are deposited on top of substrates using thermal decomposition of the source gases. The two biggest issues in using LPCVD to fabricate films on large substrates such as those 300 mm×300 mm at relatively low temperatures while maintaining high productivity are the deposition rate (DR) and the uniformity. For example, consider the deposition of a silicon layer on a large area, conventional, low cost glass substrate as mentioned previously. For substrates 300 mm×300 mm or larger, distortion of the substrate from its own weight will occur during film growth, regardless of the setting of the substrate, unless the deposition temperature is kept below about 450° C. It goes without saying that such thermal distortion decreases for lower deposition temperatures; but for the distortion to decrease to such an extent that it has absolutely no effect on later process steps such as exposure during patterning, the deposition temperature must be less than about 430° C. Although semiconductor films such as silicon are deposited at a low temperature of 425° C. using higher silanes like disilane, decreasing the deposition temperature to such levels results in an extremely low deposition rate. Therefore, in order to obtain a high deposition rate even at such a low deposition temperature, the deposition pressure is increased. Since gas density is proportional to pressure, an increase in deposition pressure is equivalent to an increase in the source gas density. The result is an increased rate of transport of the source gases over the substrate surface and hence a higher deposition rate. Unfortunately, however, using such a deposition procedure causes the outer region of large substrates to be especially thick; and the result is a deterioration in the film uniformity over the surface of the substrate. The difference in film thickness between the central and outer portions of the substrate becomes conspicuous as the substrate size increases as well as when the deposition temperature decreases. One reason for this seems to be the generation of turbulence at the substrate edge when the rate of source gas transport increases. As a result of the turbulence, a significantly large amount of gas is transported to only the edge regions with the final result being that the film is thicker along the edges as compared to the central portion of the substrate. Another reason seems to be that the transport rate of the gases to the center of the substrate decreases as the substrate size increases. In other words, in order to obtain both a high deposition rate and uniform film thickness distribution at low temperatures less than 450° C. or less than about 430° C., it is essential to always have a high gas phase transport rate regardless of whether it is at the edge or center of the substrate as well as to minimize the generation of turbulence at the substrate edge. The inventor has performed a series of experiments which has shown that for a vacuum level characterized by a source gas partial pressure (disilane partial pressure if disilane is the source gas) of between about 10 mtorr and 5 torr during deposition, the degree of turbulence and differences in transport rate are dependent upon the spacing, d, between substrates in the LPCVD reactor and can be controlled to a certain degree. In the experiments, it was recognized that film thickness uniformity generally tended to improve as the substrate spacing d increased; and, further, that in order to obtain the same level of uniformity for larger substrates, an even larger substrate spacing was necessary. It appears that the uniformity improved as a result of two phenomena. As the substrate spacing was increased by a certain degree, there was an increase in effective gas transport to the center region, and the difference in the amount of transport between the central and outer regions decreased. Additionally, the generation of turbulence at the substrate perimeter also decreased. Specifically, in the deposition temperature range of about 410° C. to 440° C., film thickness uniformity can be improved by satisfying the conditions of equation (1) shown below for substrates having an area greater than or equal to about 90000 $mm^2$ (substrate size of 300 mm×300 mm):

$$d \geq 0.02 \times S^{1/2} \ (mm) \tag{1}$$

For example, a substrate spacing d of 6 mm or more for 300 mm×300 mm substrates in a LPCVD reactor is good.

Excluding the outer 1 cm of 300 mm×300 mm substrates, the variation in film thickness was 3.4% when the substrates were set 7.5 mm apart in an LPCVD reactor for the following deposition conditions: actual deposition temperature of 425° C., disilane flow rate of 200 sccm, helium flow rate of 1000 sccm, pressure of 1.2 torr, disilane partial pressure of 200 mtorr, and a deposition rate of 0.85 nm/min. (Film thickness variation is defined as (max−min)/(max+min) in which max and min are the maximum and minimum film thicknesses, respectively, in the 280 mm×280 mm area of the substrate which excludes the outer 1 cm around the perimeter.) In contrast, a film thickness variation of 8.9% was obtained for the same-size substrates under the exact same deposition conditions when the substrates were placed 5 mm apart in the LPCVD reactor. As will be explained in another section, the semiconductor film thickness has a strong influence on the performance of the thin film semiconductor devices. As long as the film thickness variation is less than about 5%, however, there is essentially no problems in variation of device performance. In a similar manner, while a film thickness variation of 4.2% was obtained when 360 mm×465 mm substrates were loaded in the LPCVD reactor with a spacing of 10 mm, the variation was 10.1% for a spacing of 7.5 mm. According to equation (1), a substrate spacing of greater than or equal to 8.2 mm is necessary for 360 mm×465 mm substrates; and this is faithfully supported by the actual results. In this manner, a reactor with a 120 cm wide uniform thermal zone can process 100 substrates if the substrates are spaced 10 mm apart even if dummy substrates are placed one each at the top and bottom (or front and back). As will be explained in the following section, the processing time for one batch using the deposition procedure in this invention is on the order of 3 hours. Consequently, the processing time for a single substrate (called the tact time in this invention) is one minute and 48 seconds. When LPCVD reactor maintenance and down time is added, the tact time becomes 2 minutes. In other words, it is possible to fabricate thin film semiconductor devices with good thickness uniformity and high productivity.

As mentioned previously, a decrease in deposition temperature accompanies a decrease in deposition rate and makes the attainment of uniformity difficult. If the deposition temperature is less than about 410° C., equation (2) below replaces equation (1):

$$d \geq 0.04 \times S^{1/2} \ (mm) \quad (2).$$

If the substrates are set according to equation (2), good uniformity is possible just as in the case of equation (1). As shown in FIG. 3(a), when two substrates are placed back-to-back in a vertical configuration as one pair in a horizontal LPCVD reactor for deposition of a semiconductor film, the distance between adjoining pairs corresponds to the substrate spacing d. Considering the previous example of 360 mm×465 mm substrates, it becomes possible to process 200 substrates in a single batch; and, further, the productivity is increased by a factor of two. A similar relationship holds for vertical LPCVD reactors. In this case as well, two glass substrates are placed back-to-back as one pair and set approximately horizontal. In other words, in one pair of glass substrates, the front of the lower substrate is facing down while the front of the upper substrate is facing up. As for the case of the horizontal reactor, the spacing between pairs of substrates corresponds to the substrate spacing d. See FIG. 3(b). FIG. 4 shows one problem which occurs when large substrates are set horizontally in a hot-wall vertical LPCVD reactor. The center region of the substrate warps. This warp increases as the substrate size increases and also increases for lower glass strain point substrates. Conversely, high strain point glass substrates with good thermal resistance tend to have higher prices. As shown in FIG. 3(b), when setting several glass substrates in two-substrate pairs in an LPCVD reactor, semiconductor films are deposited using substrates with different strain points paired together with the high strain point glass substrate used on the bottom. Because the high strain point glass has little warp, the low strain point glass substrate placed on top can also be made to have little warp using this technique. As a result, it is possible to use even cheaper glass substrates. That is, pairing two glass substrates not only simply increases the productivity by a factor of two, but also allows the price of one LCD to be easily reduced.

2-4, LPCVD Semiconductor Film Deposition using the Present Invention

As explained in the preceding section, a deposition temperature which is as low as-possible is desirable for use with conventional, large area glass substrates. A decrease in deposition temperature, however, also means a decrease in deposition rate. In addition to the obvious decrease in productivity which results from the longer time necessary for film deposition with a lower deposition rate, a slower deposition rate also has deleterious effects on thin film semiconductor device performance. Put another way, in the fabrication of a good thin film semiconductor device with a silicon-containing semiconductor layer by the low temperature process, when depositing the semiconductor film using disilane or a higher silane at a deposition temperature less than 450° C., especially less than or equal to approximately 430° C., if the deposition rate is about 0.20 nm/min or higher, a high mobility thin film semiconductor device can be achieved. Further, if the deposition rate is about 0.60 nm/min or more, it is possible to decrease the variation of transistor properties within a single substrate. Additionally, it is possible to fabricate a thin film semiconductor device having good transistor properties using a poly—Si TFT in which the gate $SiO_2$ insulator layer is formed without the use of ECR-PECVD, and in which the pure silicon semiconductor film is deposited at a deposition temperature less than about 430° C. with a deposition rate of about 0.20 nm/min or more and is stable with respect to laser variations during melt crystallization. In fact, amorphous silicon films deposited at a deposition temperature of 400° C., disilane flow rate of 200 sccm, helium flow rate of 1000 sccm, pressure of 880 mtorr, disilane partial pressure of 147 mtorr, and a deposition rate of 0.12 nm/min as well as those deposited at a deposition temperature of 425° C., disilane flow rate of 200 sccm, hydrogen flow rate of 200 sccm, pressure of 131 mtorr, disilane partial pressure of 65.5 mtorr, and a deposition rate of 0.19 nm/min showed black spots throughout transmission electron micrographs and had small grain sizes following crystallization by RTA. As a result, the mobilities were also low when these films were employed as the active layer in transistors. Although the details may not be certain, the following explanation may explain why black spots are seen in transmission electron micrographs and transistor properties degrade when films are deposited with a deposition rate less than 0.20 nm/min. Perhaps if the growth rate is excessively slow, the surface of the growing film is exposed for a longer time to the gas phase with the result being that more impurities from the background vacuum are incorporated. Therefore, the lower limit of the deposition rate depends on the background pressure in the LPCVD reactor. In other words, in an LPCVD reactor with a background pressure of $1 \times 10^{-7}$ torr to $1 \times 10^{-6}$ torr such as the one in the present invention, a good semiconductor film can be deposited if the deposition rate is greater than or equal to 0.20 nm/min. If the deposition rate becomes greater than or equal to 0.60 nm/min, the effects from gas impurities disappear completely; and the amount of variation in transistor properties decreases as well. Further, as will be explained later, the optimum film thickness of the semiconductor film for a thin film semiconductor device formed by LPCVD in the present invention is about 50 nm. Therefore, the deposition time is on the order of 80 minutes for a deposition rate greater than or equal to 0.60 nm/min. including the approximately 20 minutes necessary to insert the substrates in the LPCVD reactor and pull a vacuum, the approximately one hour for preliminary heating prior to film growth, the aforementioned one hour and 20 minutes for deposition, and the approximately 20 minutes necessary for pulling a vacuum after film growth and unloading the substrates, the total processing time for one batch is about three hours. As shown in the previous section, the tact time for processing a batch of 100 substrates is about two minutes; and extremely high productivity with a tact time of less than one minute can be realized if the method of pairing two substrates together is used.

As has been explained in the preceding sections, in order to reliably fabricate a high performance poly—Si TFT on large substrates with the low temperature process, a silicon-containing semiconductor film deposition temperature of less than approximately 430° C., deposition rate greater than or equal to 0.6 nm/min, and a film thickness variation of less than about 5% over a large substrate are ideally required. For the case in which a higher silane such as disilane is used as the source gas in film formation using LPCVD, these conditions can be satisfied by a providing a relationship between the total surface area A (cm$^2$) inside the LPCVD reactor which can be covered with the semiconductor film and the flow rate Q (sccm) of the higher silane introduced into the deposition chamber during growth. In other words, by controlling the higher silane flow rate per unit area, R (sccm/cm$^2$) which is given by $$R=Q/A,$$

it is possible to satisfy the three ideal conditions mentioned above. In the growth of semiconductor films by LPCVD, the deposition temperature mainly determines the chemical reaction rate at the surface of the substrates. On the other hand, there is a positive correlation between the spatial concentration of the source gas and the rate of transport of the source gas in the gas phase. The concentration of the source gas C is related to the source gas pressure P and the temperature $T_g$ by $$C=P/kT_g$$

in which k is the Boltzmann constant. When further increasing the deposition rate with the deposition temperature set at a fixed value, that is, with the potential rate of surface reaction fixed, it is common to increase the actual surface reaction rate by increasing the source gas pressure P to increase the rate of transport in the gas phase. But, as mentioned previously, increasing the deposition rate by increasing the pressure unfortunately harms the film thickness uniformity. While this fact is recognized, the pressure inside the deposition chamber P is related to the pumping speed S and the gas flow rate Q by $$P=Q/S.$$

Here there are three independent variables related by a single equation which results in the existence of two independent variables. In other words, if only pressure P is fixed, it is not possible to determine a single physical condition. This means that for an identical pressure of 100 mtorr, a system with a gas flow rate of 100 sccm and a pumping speed of 1 sccm/mtorr is completely different than a system with a gas flow rate of 1 sccm and a pumping speed of 0.01 sccm/mtorr. The inventor noticed this fact, and examined what kind of effect changes in the deposition chamber pumping speed and the disilane source gas flow rate had on the deposition rate and the film thickness uniformity while keeping the deposition temperature and deposition pressure constant. The results showed that even for a fixed deposition temperature and deposition pressure, the deposition rate increased along with increases in source gas flow rate; and further that the film thickness uniformity was improved. Additionally, this relationship was recognized to be strongly related to the total surface A inside the reaction chamber; and that it is necessary to increase the source gas flow rate in proportion to the total surface area. This will be explained using FIG. 5. Amorphous silicon films were deposited in a 184.5 l vertical, hot wall LPCVD reactor with thirty five 300 mm×300 mm substrates placed a distance of 10 mm apart. The total surface area of the 35 substrates was 63000 cm$^2$ since the area of one substrate (front and back) is 30 cm×30 cm×2 or 1800 cm$^2$. Since the surface area of regions inside the reactor which can be coated with the semiconductor film during deposition is 25262 cm$^2$, the total surface area which can be coated inside the reactor is $$A=63000+25262=88262\ cm^2.$$

Under these conditions, semiconductor films were deposited by flowing only disilane into the deposition chamber at a deposition temperature of 425° C. and a deposition pressure of 320 mtorr. The disilane flow rate was varied from 50 sccm to 400 sccm while the deposition pressure was kept constant at 320 mtorr by varying the deposition chamber pumping speed by means of the LPCVD reactor pressure control unit. The deposition rate as a function of disilane flow rate under the given conditions is shown by the circular data points and the "DR" solid line in FIG. 5 while the film thickness variation is shown by the square data points and the "V" dashed line. Since A is 88262 cm$^2$, the corresponding R values for the given flow rates, Q, are: Q=50 sccm, R=5.66× $10^{-4}$ sccm/cm$^2$; Q=100 sccm, R=1.13×$10^{-3}$ sccm/cm$^2$; Q 200 sccm, R=2.27×$10^{-3}$ sccm/cm$^2$; and Q 400 sccm, R=4.53 ×$10^{-3}$ sccm/cm$^2$. For R greater than 2.27×$10^{-3}$ sccm/cm$^2$, the deposition rate is essentially saturated; and the surface reaction rate and the potential rate of surface reaction nearly agree. As discussed previously, for a fixed deposition temperature and deposition pressure, a higher deposition rate is preferred from both the viewpoint of productivity and the viewpoint of semiconductor film quality. When the deposition rate is high, the film growth rate is large compared to the nucleation rate so that both the grain size in the films after crystallization increases and the amount of impurity gases from outgassing incorporated into the film is decreased. Both of these factors lead to improvement in the semiconductor film quality and mean increases in mobility and decreases in threshold voltage when these films are used as the active layer in thin film semiconductor devices.

Additionally, the decrease in impurity incorporation leads to suppression of the poly—Si TFT off current. On account of these factors, a high deposition rate is preferred, and as seen in FIG. 5, this value saturates for R greater than or equal to 2.27×$10^{-3}$ sccm/cm$^2$. Consequently, a value of the higher silane flow rate per unit area of about 2.27×$10^{-3}$ sccm/cm$^2$ or more is preferred for the deposition of semiconductor films. The present experiment was performed in a vertical reactor with the gas introduced from the top and exhausted from the bottom. Using R=5.66×10⁻³ sccm/cm² resulted in a difference in deposition rate of 18% between the upper most substrate and the lower most substrate. For R greater than or equal to about 1.13×10⁻³ sccm/cm², this difference was practically unobservable; and, therefore, to obtain uniformity among substrates, an R value greater than or equal to about 1.13×10⁻³ sccm/cm² is desirable. Further, as seen in FIG. 5, an R≧4.54×10⁻³ sccm/cm² is ideal since the variation within a single substrate is 5% or less and gives a high deposition rate of 1.30 nm/min.

The source gas flow rate which corresponds to the total surface area in the LPCVD reactor which can be covered with a semiconductor film must also be varied. In other words, the parameter which must be controlled is the higher silane flow rate per unit area, R. The exact same experiment described above was repeated with seventeen 235 mm×235 mm substrates placed a distance of 20 mm apart in the LPCVD reactor. The substrate area was 23.5 cm×23.5 cm×2×17=18777 cm². This was combined with the reactor area of 25262 cm² to yield a total surface area of 44039 cm². R values of about 5.66×10⁻⁴ sccm/cm², 1.13×10⁻³ sccm/cm², 2.27×1 sccm/cm², and 4.53×10⁻³ sccm/cm² correspond to higher silane flow rates of 25 sccm, 50 sccm, 100 sccm, and 199 sccm, respectively. When the deposition rate and film thickness uniformity among substrates was examined for the given disilane flow rates, behavior identical to that found previously was confirmed. That is, in addition to the deposition temperature and deposition pressure, the higher silane flow rate per unit area is a parameter necessary to unambiguously define the physical system. According to the discovery above, an R value of about 1.13×10⁻³ sccm/cm² or more is required for the deposition of a silicon-containing film at a deposition temperature of about 430° C. or less and a disilane partial pressure of about 100 mtorr or more. For example, for the deposition of a semiconductor film using one hundred 400 mm×500 mm substrates set 15 mm apart in a 900 mm diameter cylindrical deposition chamber, the substrate surface area is 400000 cm²; and the surface area inside the deposition chamber is about 56550 cm², leading to a total surface area A of about 456500 cm². Therefore, the minimum necessary silane flow rate is given by the R value of 1.13×10⁻³ sccm/cm² multiplied by the area A or 518 sccm. Similarly, a minimum flow rate of about 1050 sccm is necessary for semiconductor film deposition in the case in which there are one hundred 560 mm×720 mm substrates placed 25 mm apart in a 1200 mm diameter chamber since A is approximately 919500 cm² and R≧1.13 ×10⁻³ sccm/cm².

2-5, Poly—Si TFT Channel Layer Thickness and Transistor Properties

Here, the relationship between the semiconductor film thickness of the active layer forming the channel in a poly—Si TFT thin film semiconductor device and the transistor properties will be discussed. Generally, the optimum film thickness for the semiconductor film to be used as the channel in a thin film semiconductor device depends strongly on the fabrication method. This is because the film quality of the semiconductor film varies widely with the film thickness. For example, in systems such as SOS (silicon on sapphire) and SOI (silicon on insulator) in which the film quality does not, as a rule, depend on the film thickness, the transistor properties improve for thinner semiconductor films. (Here, this principle is called the thin film effect.) This is because the inversion layer quickly spreads throughout the entire film thickness and the inversion layer can form readily in the case of thin semiconductor films (the threshold voltage Vth decreases). On the other hand, in thin film semiconductor devices using polycrystalline silicon films for the channel layer, the quality of the semiconductor film is vastly different depending on the film thickness; and the mechanism mentioned above is much more complicated. Usually, the film quality of polycrystalline films worsens as the film thickness decreases. Specifically, in comparison to thick films, the grain size in thin films is smaller; and the number of internal grain defects and grain boundary traps is simultaneously large. If the grain size is small, the mobility of thin film semiconductor devices using such films will be low. Additionally, if the number of internal grain defects and grain boundary traps is large, the spread of the depletion layer slows; and the threshold voltage Vth increases substantially. (Here, this principle is called thin film degradation.) Ultimately, the thin film effect mentioned earlier and thin film degradation are competing processes. If the films are made thin but there is little change in film quality (thin film degradation is small), the thin film effect is applicable; and the transistor properties improve with thinner films. Conversely, if the films are made thin and there is a remarkable degradation of the film quality (thin film degradation is large), the thin film effect is canceled; and transistor properties worsen for thinner films. In other words, depending on the magnitude of the film quality dependence on the film thickness, the transistor properties may improve or may worsen with the use of thinner films. This dependence of film quality on film thickness differs depending on fabrication technique; and also differs depending on film thickness. Consequently, the optimum semiconductor film thickness is completely different depending on the fabrication process of the thin film semiconductor device; and the optimum thickness value must be determined for each fabrication process.

2-6, Optimum Film Thickness for the LPCVD—Crystallization Method

Here, the optimum poly—Si TFT semiconductor film thickness for a semiconductor film fabricated by first using LPCVD at a deposition temperature less than about 450° C., ideally about 430° C. or less, followed by crystallization for use in a low temperature process thin film semiconductor device of the present invention as described above is explained. Using LPCVD at less than about 450° C., or less than or equal to about 430° C., the deposited film can coalesce to form a continuous film when the film thickness reaches approximately 10 nm or more. If a continuous film does not form but only island regions exist, the semiconductor "on" characteristics will be extremely poor because the film will still be discontinuous after crystallization regardless of the use of melt crystallization or solid phase crystallization. In short, thin film degradation has overwhelmingly defeated the thin film effect. Therefore, the minimum film thickness for LPCVD—crystallization is on the order of about 10 nm. As film thickness reaches about 20 nm or more, the transistor properties of melt crystallized films begin to improve. In the melt crystallization of semiconductor films, crystallization occurs with the gathering of peripheral semiconductor atoms around a single central nucleus during the cooling solidification stage. Because of this, when film thickness is less than about 20 nm, even if a continuous film forms immediately after deposition by LPCVD, cracks and crevices are generated throughout the film following melt crystallization; and transistor properties still do not improve. In other words, in LPCVD—melt crystallization, thin film degradation dominates for films less than about 20 nm. As the film thickness reaches more than about 20 nm, thin film degradation gradually decreases; and the thin film effect begins to rival thin film degradation. Continuing the trend in increased film thickness, transistor properties are best for film thickness between about 20 nm and about 80 nm. For thicknesses greater than about 80 nm, the thin film effect predominates, and transistor properties deteriorate along with increases in film thickness. For semiconductor films about 30 nm or thicker, stable and reliable production is possible. Particularly with the advance of high precision processing, the problem of contact failure between the semiconductor film and the metallization can be decreased significantly for films approximately 30 nm or thicker when such processes as reactive ion etching (RIE) are used to open contact holes in the interlevel insulator layer or the gate insulator layer. Usually the combined thickness of the gate insulator layer and interlevel insulator layer is about 600 nm; and if the film thickness variation for this thickness is 10, or a total of 20%, the difference in film thickness between the thinnest insulator layer and the thickest insulator layer is on the order of 120 nm. Since the selectivity ratio of RIE with respect to semiconductor films is about 1:10, approximately 10–15 nm of the semiconductor layer lying beneath the thinnest insulator layer is removed during the opening of contact holes in the thickest insulator layer. Thus, even if about 15 nm is lost in such a manner during the opening of contact holes, the contact resistance is sufficiently low and the problem of contact failure does not occur if the semiconductor film thickness is about 30 nm or more. If the semiconductor film thickness is less than or equal to about 70 nm, the entire semiconductor layer can be uniformly heated and crystallization can proceed smoothly during melt crystallization using a laser or other means. If, however, the film thickness is greater than about 140 nm, only the upper portion of the layer is melted during laser irradiation from above and the bottom portion of the layer retains amorphous regions. This adds to the thin film effect and the transistor properties deteriorate profoundly. In other words, the maximum film thickness for the LPCVD—crystallization method is on the order of 140 nm.

2-7, Semiconductor Film Deposition Using the PECVD Process of this Invention

The method of forming the semiconductor film of the thin film semiconductor device of this invention using the PECVD process will be described. The PECVD reactor used here is the capacitively-coupled type. The plasma uses industrial frequency rf waves (13.56 MHz) and is generated between two parallel plate electrodes. Of the two parallel plate electrodes, the lower parallel plate electrode has ground electrical potential. The substrate on which the semiconductor film is to be deposited is placed on this electrode. The rf waves are supplied to the upper parallel plate electrode. In addition, multiple gas introduction ports exist in the upper parallel plate electrode, and the source gases are supplied in a uniform laminar flow from this electrode to the deposition chamber. The pressure at the time the film formation takes place is from approximately 0.1 torr to approximately 5 torr. The distance between the parallel plate electrodes can be varied from about 10 mm to about 50 mm.

After forming the underlevel protection layer on at least a portion of the substrate surface using an insulating material, such as a silicon oxide film, a semiconductor film is formed on top of this underlevel protection layer. Ultimately, a thin film semiconductor device that uses the semiconductor film as the transistor's active layer will be produced. When a semiconductor film is to be deposited using the PECVD process, initially the underlevel protection layer is exposed to an oxygen plasma after the substrate has been placed in the deposition chamber of the PECVD reactor. The oxygen plasma is generated at an electrode spacing of about 15 mm to 35 mm, a pressure of about 1.0 torr to 2.0 torr and an rf power density of approximately 0.05 w/cm$^2$ to 1 w/cm$^2$. The temperature of the substrate is the same 250° C. to 350° C. as that during semiconductor deposition, and the oxygen plasma exposure time is from about 10 seconds to one minute. After exposure to the oxygen plasma, the plasma is temporarily stopped and the deposition chamber is pumped down for 10 seconds to 30 seconds. If the vacuum pump-down takes place for 15 seconds or more, the level of the vacuum in the deposition chamber will be 1 mtorr or lower. This takes place to prevent oxygen from being incorporated into the semiconductor film during semiconductor film deposition in the subsequent process step. After pulling the vacuum, the source gases that are used for semiconductor film deposition, such as silane and hydrogen, are allowed to flow for 10 seconds to two minutes without generating a plasma. During this time, the conditions inside the deposition chamber, such as the pressure and source gas flow rate, are the same as those used during semiconductor film deposition. Because this will result in the oxygen in the deposition chamber being entirely replaced by the source gas, the incorporation of oxygen into the semiconductor film will be minimized. Further, if the period of gas flow is 30 seconds or more, the temperature of the substrate is maintained at a constant temperature, and the semiconductor film can always be deposited under the same conditions. In the thin film semiconductor device of this invention, the upper-most layer of the underlevel protection layer is composed of a film such a silicon oxide, which has a low nucleation rate. Since this silicon oxide film is formed using the CVD process or the PVD process, there will always be dangling bonds of the silicon. For this reason, if the semiconductor film is formed on top of the underlevel protection layer without some kind of pre-treatment, the dangling bonds would act as fixed electrical charges within the underlevel protection layer. As previously stated, when the semiconductor film is thin, at or below a few hundred nanometers, these fixed electrical charges will cause negative influences on the thin film semiconductor device, such as causing variations in the threshold voltage (Vth). By applying an oxygen plasma to the surface of the underlevel protection layer, the dangling bonds will bind with the oxygen atoms, and thus drastically reduce the fixed electrical charges within the underlevel protection layer. In other words, even though the semiconductor film is made thin enough to improve the semiconductor properties, instabilities in the properties, such as the Vth fluctuations caused by the underlevel protection layer, can be resolved. Moreover, the exposure to oxygen plasma will clean the surface of the underlevel protection layer through the oxidation reaction (combustion) and restrain even further the nuclei generation rate at the initial stage of semiconductor deposition. This will increase the purity of the semiconductor film, enlarge the areas that form the deposited film, and enlarge the crystal grains that form the crystallized semiconductor film. In terms of the properties of the thin film semiconductor device, this is manifest as a decrease in the off current, a reduction in Vth, an improvement in the switching properties because sub-threshold swing will steepen, and an increase in the mobility.

To improve the underlevel protection layer surface, in addition to exposure to an oxygen plasma, exposure to a hydrogen plasma is also effective. That is, after the substrate on which the semiconductor film is to be deposited is placed inside the PECVD reactor, the underlevel protection layer on the substrate is first exposed to a hydrogen plasma. Then, without breaking vacuum, the semiconductor film is sequentially formed on top of the underlevel protection layer. The semiconductor deposition conditions use a lot of hydrogen, as in hydrogen 3000 sccm and monosilane 100 sccm. Furthermore, when the ratio of hydrogen is 10 times or more that of silane, it is also possible to have continuous processing, from hydrogen plasma processing to semiconductor film formation, without stopping the plasma. When the semiconductor film deposition conditions differ from the hydrogen plasma conditions, as with monosilane 100 sccm in argon 7000 sccm, the plasma is temporarily terminated after the hydrogen plasma processing; and, except for the fact that the plasma is not generated, it is desirable to have all other process parameters the same as for the semiconductor film deposition conditions in order to create a stabilization period before the deposition. Doing so will allow the substrate temperature to always be constant when the semiconductor film is deposited. The hydrogen plasma processing time is from 10 seconds to one minute, and the stabilization period before the semiconductor film deposition is from 10 seconds to two minutes.

Of the dangling bonds in the underlevel protection layer, there are those that are terminated by oxygen, as in Si—*, and those that cannot be terminated by oxygen, as in Si—O—*. Because hydrogen plasma exposure can terminate these dangling bonds in the form of Si—H and Si—OH, an extraordinary effect can be observed in the decrease in the fixed electrical charges in the underlevel protection layer. In addition, because hydrogen plasma processing also has the effect of etching and cleaning the underlevel protection layer surface, it also increases the purity of the semiconductor film. Further, the adhesion of the underlevel protection layer and the semiconductor film improves dramatically as a result of this cleaning. When a semiconductor film is formed using the PECVD process, crater-shaped holes can be generated in the semiconductor film; and the film sometimes peels off depending on the deposition conditions. This can be prevented, however, by processing with hydrogen plasma.

When a semiconductor film is-deposited, it is even more desirable to process with both oxygen plasma and hydrogen plasma. In other words, initially expose the surface of the silicon oxide underlevel protection layer to an oxygen plasma. At first, dangling bonds in the underlevel protection layer will be terminated by the oxidation reaction. At the same time, the surface will be cleaned by means of combustion, and this will suppress the rate of nuclei generation. Next, the oxygen plasma is terminated, and a vacuum is pulled for a period of from about 10 seconds to one minute to remove the oxygen within the deposition chamber. The underlevel protection layer is then sequentially exposed to a hydrogen plasma without breaking vacuum. Some dangling bonds that could not be terminated with the oxygen plasma will be terminated with the hydrogen plasma, and this will reduce the fixed electrical charges in the underlevel protection layer to a minimum. Moreover, the surface will become even cleaner and at the same time the adhesion between the semiconductor film and the underlevel protection layer will also improve. After processing with the hydrogen plasma, vacuum pump-down and substrate heating will take place as needed; and the semiconductor film is formed on the underlevel protection layer sequentially without breaking vacuum. Doing this will not only bring about both the previously mentioned oxygen plasma effect and hydrogen plasma effect, but there will also be a clear reduction in the amount of oxygen incorporation into the semiconductor film since the hydrogen plasma step comes between the oxygen plasma step and the formation of the semiconductor film. This will also allow a higher purity and higher quality semiconductor film to be obtained. As stated in section (2-1), for a melt crystallized semiconductor film, a clean underlevel protection layer surface and control of the underlevel protection layer—semiconductor interface are particularly important. Consequently, the underlevel protection layer surface processing prior to semiconductor film deposition is exceptionally significant.

Next, the processing after the semiconductor film has been formed using the PECOM process will be described. After the semiconductor film has been formed on top of the underlevel protection layer, it is desirable to sequentially expose the semiconductor film to a plasma without breaking vacuum. This will terminate the dangling bonds of the semiconductor atoms, such as those of silicon. This is particularly effective when the film is formed under conditions in which there is little hydrogen when the semiconductor film is deposited. For example, it is particularly effective in a system in which the amount of hydrogen is less than 50 percent of the gases that are introduced to the deposition chamber, such as when the semiconductor film is deposited using silane mixed with inert gases such as helium or argon. When a semiconductor film is deposited using such a system, a huge number of dangling bonds will exist in the film. Since these dangling bonds are extremely chemically active, they will react with a variety of impurities and substances that exist within the atmosphere, or these materials can physically adsorb. If crystallization takes place in such a condition using a laser, for example, the purity of the semiconductor will decrease. In addition, the grains will become smaller since the adsorbed substances become the nuclei for crystal growth. Such problem points can be easily eliminated by hydrogen plasma processing. In other words, a high purity, high-quality semiconductor film is in and of itself unstable and can be contaminated by the atmosphere. Such a high purity, high-quality film, however, can be stabilized by applying a hydrogen plasma after the film has been formed.

After the semiconductor film has been formed on top of the underlevel protection layer, the same type of effect can also be accomplished by sequentially exposing the semiconductor film to an oxygen plasma without breaking vacuum. When the semiconductor film is silicon or when silicon is the main component, oxygen plasma will form a silicon oxide film on the semiconductor film surface. This oxide film is extremely stable. Compared to the semiconductor film surface, its ability to prevent chemical and physical contaminant adsorption as well as diffusion of such contaminants to the semiconductor film is excellent. That is, it is optimal for protecting the semiconductor film from external contaminants. Further, because the oxidation takes place using an oxygen plasma in which the oxygen is quality-adjusted for high purity as opposed to oxygen in the atmosphere, the purity of the oxide film itself is high. During subsequent crystallization, it is desirable to remove the oxide film. Yet, even if the oxide film is not removed, there are virtually no problems with contaminants from the oxide film being incorporated into the semiconductor film.

Ideally, after the semiconductor film has been deposited using a PECVD reactor, the film is exposed to a hydrogen plasma sequentially without breaking vacuum, and this will inactivate most of the dangling bonds by hydrogen termination. Subsequent to this and again sequentially without breaking vacuum, the semiconductor film is exposed to an oxygen plasma. This oxygen plasma will terminate any dangling bonds that were not terminated by the hydrogen plasma and can also be expected to form on the surface of the semiconductor film a highly pure silicon oxide film that protects the semiconductor film from external contamination. Using this method of processing, not only will both the hydrogen plasma effect and the oxygen plasma effect be obtained, but also the effect of the dangling bond termination will increase and the amount of oxygen incorporated into the semiconductor film can be reduced. As a result, the semiconductor film purity after the crystallization will increase more so than processing with the oxygen plasma alone, forming a better thin film semiconductor device.

In the oxygen plasma exposure stage, as stated previously, regardless of the LPCVD and PECVD processes and even if the greatest amount of care is taken so that the semiconductor film becomes very pure, because an oxide film exists on the surface of the semiconductor film, the quality of the crystallized film will decrease if oxygen is incorporated into the semiconductor film during crystallization. This situation becomes particularly serious in the case of melt crystallization such as by laser irradiation.

A semiconductor film which has been carefully prepared using underlevel protection layer surface preparation and the LPCVD and PECVD processes, as in this invention, requires that the same type of care be taken when crystallizing. In other words, when a semiconductor film that forms the active layer of a thin film semiconductor device is formed by melt crystallization, such as by laser irradiation, it is desirable to remove the oxide film from the semiconductor film surface immediately prior to melt crystallization. Doing so will allow the amount of oxygen from the oxide layer that gets into the semiconductor film to be reduced to a minimum when semiconductor film melting occurs. If the amount of oxygen that gets into the semiconductor film is reduced, not only will the crystallinity of the crystallized film increase, the defect density will decrease and the transistor properties will greatly improve.

The processing method that makes the removal of the oxide film immediately prior to crystallization the easiest is one that uses a hydrofluoric acid solvent. Of course, the oxide film can be removed by a gas-phase plasma process such as by using an $NF_3$ plasma. It is desirable to crystallize the semiconductor film immediately after removing the oxide film. If the semiconductor film is melt crystallized within two hours of the completion of the oxide film removal process, the amount of oxygen that gets into the semiconductor film will be extremely low.

2-8, Melt Crystallization of a Mixed-Crystallinity Semiconductor Film

The thin film semiconductor device of this invention is most effective for top-gate poly—Si TFTs which are produced at temperatures of 350° C. or lower for all process steps from the formation of the gate insulator layer forward. As a consequence, if the semiconductor film formation step can take place at a temperature of 350° C. or lower, all of the process steps will take place at 350° C. or lower. Currently, the thickness of the conventional glass substrates for LCDs is 1.1 mm. If this were 0.7 mm, however, not only would the glass substrates become cheaper, but also major benefits in the portability and the production of the LCDs would arise because of the lighter-weight substrate. Since the density of glass is approximately 2.5 $g/cm^3$, the weight of one sheet of glass with dimensions of 400 mm×500 mm×_1.1 mm, for example, is about 550 grams. If such glass substrates were processed in batches of 100 sheets, the weight would be 55 kg, which would be a large load for production equipment and for transport robots. It goes without saying that if the thickness were 0.7 mm, the weight of a batch would decrease to 35 kg, significantly reducing the load. For this reason, thinning of the glass substrates is desirable. Such a large thin film glass would bow significantly under its own weight, however, even at room temperature as shown in FIG. 4. And no matter what method were used with the LPCVD process, a semiconductor film could not be formed. In other words, in order to use such a large piece of thin glass, the semiconductor film would have to be formed using the PECVD process at a temperature of 350 degrees C. or lower. Yet, in general, because of low density of the films and the large amount of incorporated hydrogen, an amorphous semiconductor film formed using the PECVD process cannot crystallize unless it first undergoes thermal annealing at 450° C.

When the inventor conducted various studies of semiconductor films from the PECVD process, it was discovered that when using the PECVD process at a deposition rate of about 0.1 nm/s or higher, a mixed-crystallinity semiconductor film was produced and when this mixed-crystallinity semiconductor film was exposed to laser light, melt crystallization was possible even without the thermal annealing step mentioned above. Although the existence of crystal structure in this mixed-crystallinity film can barely be observed by Raman spectrometry, for instance, it is difficult to call the film polycrystalline. In addition, the density is as low as the amorphous silicon formed using the PECVD process of the prior art, and hydrogen atoms are contained at Just under 20 percent of the silicon atoms. The details of why such a film can be melt crystallized in an orderly manner are not known. But it is believed that it might be that the amorphous region is more easily melted than the microcrystalline region, and that the microcrystals that float in the melted silicon liquid play the role of restricting the evaporation and the scattering of the melted silicon liquid. Yet, even for a mixed-crystallinity semiconductor film, it is difficult to melt crystallize such a film with a deposition rate of about 0.1 nm/s or lower. As in the case with LPCVD in which it seems that film quality decreases for slower deposition rates as a result of the increased ease of impurity incorporation, the incorporation of impurities during film growth in PECVD also seems to be the main factor leading to difficulties in crystallization. In contrast to a background vacuum pressure in the $10^{-7}$ torr range using LPCVD reactors, the background vacuum pressure is in the $10^{-4}$ torr range in PECVD reactors, and this may be the reason that high-speed film deposition can be observed using PECVD. In addition, if the deposition rate was 0.37 nm per second or higher, there was an improvement in the adhesion between the semiconductor film and the underlevel protection layer; and the generation of crater-shaped holes and film peeling virtually disappeared. Using the PECVD process, a mixed-crystallinity silicon film can be obtained by setting the ratio of the hydrogen to monosilane flow rates to approximately 30:1. Alternatively, a mixed-crystallinity silicon film can be obtained by setting the ratio of the flow rates of inert gases like argon to that of the chemical specie containing the constitutive elements of the semiconductor film, such as monosilane, to less than about 33:1 (less than about 3 percent monosilane concentration). Based on experiments by the inventor, hydrogen-monosilane system mixed-crystallinity can also be melt crystallized without thermal annealing. The laser energy range in which melt crystallization proceeds well, however, is limited to several tens of $mJ/cm^2$. In contrast to this, an argon-monosilane system mixed-crystallinity silicon film will crystallize smoothly in a wide laser energy region, from 100 $mJ/cm^2$ to 350 $mJ/cm^2$.

Therefore, an argon-monosilane system mixed-crystallinity silicon film is more suitable as the semiconductor film of low temperature process poly—Si TFTs. The optimal argon to monosilane flow ratio for melt crystallization is from about 124:1 (approximately 0.8 percent monosilane concentration) to about 40.67:1 (approximately 2.4 percent monosilane concentration).

2-9, Optimum Film Thickness of PECVD—Crystallized Films

Here, the optimum semiconductor film thickness for a poly—Si TFT, of a low temperature process thin film semiconductor device of the present invention described above, that was fabricated through crystallization after the semiconductor film was formed using the PECVD process at a deposition temperature of 350° C. or lower will be described. Among the low temperature process thin film semiconductor devices of this invention that have been discussed above, here will be described. In the PECVD process, as in the LPCVD process, a film will become continuous when it reaches a thickness of 10 nm or more. However, the density of the semiconductor film obtained using the PECVD process is from approximately 85% to 95% of the film density obtained using the LPCVD process. For this reason, if the 10 nm semiconductor film of the PECVD process is crystallized, its film thickness will fall to about 9 nm after crystallization. Thus, the minimum film thickness of a PECV—crystallized film will be approximately 9 nm. As with LPCVD-crystallized films, if the film thickness is about 18 nm or more, the transistor properties of the melt crystallized film will begin to improve. That is, with PECVD-melt crystallization, at 18 nm or less, thin film degradation is dominant; and, at 18 nm or higher, thin film degradation decreases, and the thin film effect becomes competitive. This will continue if the film thickness is between approximately 18 nm and approximately 72 nm and the transistor properties are optimum for films within this thickness range. If the film is thicker than 72 nm, the thin film effect takes control and the transistor properties will gradually deteriorate as the thickness of the film increases. If the semiconductor film thickness is 30 nm or more, it is possible to have stable production of highly integrated thin film semiconductor devices that require fine geometry fabrication. In other words, with RIE, contacts holes can be opened up reliably without the appearance of contact failure. If the semiconductor film thickness immediately after deposition using the PECVD process is about 80 nm or less, the entire semiconductor layer can be uniformly heated and crystallization can proceed smoothly during melt crystallization using a laser or other means. After crystallization, the thickness of the film will be approximately 72 nm. If the semiconductor film immediately after deposition is about 150 nm thick or higher, only the upper portion of the layer is melted during laser irradiation from above and the bottom portion of the layer retains amorphous regions. This adds to the thin film effect and the transistor properties deteriorate profoundly. In other words, the maximum film thickness for the PECVD—crystallization method is on the order of about 135 nm after crystallization.

2-10, MOS Interface, the Gate Insulator Layer and the Thermal Environment

With this invention, the gate insulator layer is formed using CVD or PVD after the semiconductor film crystallization is finished. No matter what process is used to form the gate insulator layer, it is desirable that the insulator layer formation temperature be at 350° C. or lower. This is because it is important to prevent the thermal degradation of the MOS interface and the gate insulator layer. This same thing applies to all of the subsequent process steps. All of the process steps after forming the gate insulator layer have to be held to 350° C. or less. In general, a gate insulator layer formed using CVD or PVD has many dangling bonds within the film; and the structure of the film is also unstable. This invention terminates the dangling bonds by exposure to oxygen plasma. In addition, CVD silicon oxide films contain Si—OH groups. Dangling bonds that have been terminated by such hydroxyl groups and oxygen plasmas are unstable in heat, easily dissociating in an environment of 350° C. or higher. That is, dangling bonds such as Si—O—* and Si—* are generated again at the MOS interface and in the gate insulator layer. These become interface states or fixed charges in the insulator layer and cause a deterioration of the transistor properties. In the prior art, hydrogen plasma processing took place for an hour in order to overcome this. In this invention, however, because all of the process steps after the semiconductor film has been formed take place at 350° C. or less, such thermal degradation does not occur. For this reason, hydrogenation is not required. With this invention, a high performance, thin film semiconductor device can be produced easily and reliably. Although it is to be expected, the thermal degradation extends to the underlevel protection layer as well. As described in section (2-1), thermal degradation of the underlevel protection layer will lead to the deterioration of the properties of the thin film semiconductor device. Although it is not as sensitive as the gate insulator layer, the influence is such that it cannot be ignored. For this reason, optimization of the thin film semiconductor device is achieved, theoretically, by having all processing steps, including the semiconductor film deposition steps, take place at a temperature of 350° C. or lower. Doing so will avoid thermal degradation of both the underlevel protection layer and the gate insulator layer. Processes that can form semiconductor films at temperatures of 350° C. or lower include PECVD and sputtering.

2-11. The VHF-PECVD Reactor Used in This Invention

First of all, FIG. 2 will be used to describe the general configuration of the VHF-plasma enhanced chemical vapor deposition reactor (VHF-PECVD reactor) used in this invention. The PECVD reactor is a capacitively-coupled type, and the plasma is generated between parallel plate electrodes using a 144 MHz VHS power supply. The top drawing in FIG. 2 is an overall perspective of the reaction chamber as viewed from above, a drawing of cross section A—A' is shown in the bottom of FIG. 2. Reaction chamber 201 is isolated from the outside by reaction vessel 202, which is in a reduced pressure condition of from about 5 mtorr to 5 torr during film formation. Inside of reaction vessel 202, lower plate electrode 203 and upper plate electrode 204 are placed in mutually parallel positions. These two electrodes form the parallel plate electrodes. The space between these parallel plate electrodes is reaction chamber 201. This invention uses parallel plate electrodes with dimension of 410 mm×510 mm. Since the distance between the electrodes is variable from 10 mm to 50 mm, the volume of reaction chamber 201 varies from 2091 $cm^3$ to 10455 $cm^3$, depending on the distance between the electrodes. The distance between the parallel plate electrodes can be set freely between 10 mm and 50 mm, as stated above, by moving the position of lower electrode 203 up and down. Moreover, when set to a designated electrode distance, the deviation of the electrode distance over the 410 mm×510 mm plate electrode surfaces is a mere 0.5 mm. As a result, the deviation in the electrical field strength that appears between the electrodes is 5.0% or less over the plate electrode surfaces; and an extremely uniform plasma is generated within reaction chamber 201.

Substrate 205 on which thin film deposition is to take place is placed on top of lower plate electrode 203 and 2 mm of the substrate edge is held down by shadow frame 206. Shadow frame 206 has been omitted from the upper drawing of FIG. 2 to make the overall drawing of the PECVD reactor easy to understand. Heater 207 is installed within lower plate electrode 203. The temperature of lower plate electrode 203 can be adjusted as desired from 25° C. to 400° C. Except for the peripheral 5 mm, the temperature distribution within lower plate electrode 203 is within ±1.0° C. relative to the set-point temperature. Essentially, even if the size of substrate 205 were 400 mm×500 mm, the temperature deviation within the substrate could be maintained to within 2.0° C. For example, if a conventional glass substrate (such as Corning Japan's #7059, Nippon Electric Glass Co., Ltd.'s OA-2, or NE Techno Glass's NA35) were used as substrate 205, shadow frame 206 would hold substrate 205 down to prevent it from deforming concavely by the heat from heater 207 as well as to prevent unnecessary thin films from being formed on the edges and back surface of the substrate. The reaction gas, which is made up of source gases and additional gases as required, flows through tube 208 and is introduced into upper plate electrode 204. It then flows between gas diffusion plates 209 located inside upper plate electrode 204, and flows from the entire surface of the upper plate electrode into reaction chamber 201 at a virtually uniform pressure. If film formation is taking place, some of the reaction gas will be ionized when it exits the upper plate electrode and cause a plasma to be generated between the parallel plate electrodes. From a part to all of the reaction gas will participate in film formation. Residual reaction gas that has not participated in film formation and gases formed as a result of the film forming chemical reaction will become discharge gases and be discharged through exhaust port 210 which is in the top of the peripheral section of reaction vessel 202. The conductance of discharge port 210 is sufficiently large compared to the conductance between the parallel plate electrodes. The desired value is one that is 100 times or more of the conductance between the parallel plate electrodes. In addition, the conductance between the parallel plate electrodes is even sufficiently larger than the conductance of gas diffusion plate 209, and that desired value is also 100 times or more of the conductance of gas diffusion plate 209. Through such a configuration, reaction gas can flow into the reaction chamber virtually uniformly from the entire surface of the large 410 mm×510 mm upper plate electrode; and, at the same time, discharge gas will be discharged in all directions from the reaction chamber in an even flow. The flow rates of the various reaction gases to tube 208 will be adjusted to their designated values by mass flow controllers. In addition, the pressure within reaction vessel 202 will be adjusted to the desired value by conductance valve 211, which is located at the exit of the discharge port. A pumping system, such as a turbomolecular pump, is located on the exhaust side of conductance valve 211. In this invention, an oil-free magnetic levitation type turbomolecular pump is used as part of the pumping system, and the background vacuum within reaction vessels such as the reaction chamber is set to the $10^{-7}$ torr level. In FIG. 2, arrows are used to show the general flow of the gas. Both reaction vessel 202 and lower plate electrode 203 are at ground potential. These and upper plate electrode 204 are electrically isolated by insulation link 212. When a plasma is generated, for example, 144 MHz VHF-waves that are generated from VHF wave oscillation source 213 are amplified by amplifier 214, pass through matching circuit 215, and are applied to upper plate electrode 204.

As stated above, because the PECVD reactor used in this invention has very sophisticated intra-electrode interval control and uniform gas flow, it is a thin film formation reactor that is able to handle large substrates of 400 mm×500 mm in size. However, by merely adhering to these basic concepts, it can easily handle further enlargements in the substrate. Actually, it is possible to produce a reactor that can handle even larger substrates of 550 mm×650 mm. In addition, in this invention, a common 144 MHz VHF wave frequency was used. Of course, VHS waves using other frequencies may also be used. For example, VHF waves from 100 MHz to 1 GHz may all be used. On the other hand, if the rf frequency is from 10 MHz to several hundred MHz (VHF), it is possible to generate a plasma between the parallel plate electrodes. Therefore, frequencies such as 27.12 MHz, 40.68 MHz, 54.24 MHz and 67.8 MHz, which are whole number multiples of the industrial rf frequency (13.56 MHz) may be used. In other words, by changing VHF wave oscillator 213, amplifier 214, and matching circuit 215 of the PECVD reactor used in this invention, a plasma using electromagnetic waves of a desired frequency can be easily generated. In general, in the case of an electromagnetic wave plasma, if the frequency is increased, the electron temperature within the plasma will increase and radicals can be easily created. For this reason, as will be explained later, even if the temperature of the substrate is as low as approximately 340° C., the deposited film will already be in a polycrystalline silicon condition immediately after deposition. Thus, poly—Si TFTs can be easily fabricated even without special crystallization process steps.

2-12, Semiconductor Film Formation and the Gases Used for Formation When Using VHF-PECVD and Microwave PECVD One of the characteristics of this invention is that a film deposited by VHF-PECVD or microwave PECVD is polycrystalline immediately after deposition (an as-deposited film). It is extremely difficult to make a polycrystalline as-deposited film using normal PECVD processing. Since the substrate temperature is less than 400° C., the mobility of source materials such as silane on the surface of the growing film decreases; and the selectivity of the source material for the polycrystalline state as opposed to the amorphous state is lost. This invention eliminates this deficiency in the PECVD method by diluting source materials using noble gas elements and by using a VHF plasma or microwave plasma, both of which are capable of raising the electron temperature. To form a polycrystalline film in the as-deposited state, radicals and ions of the noble gas elements, such as helium (He), neon (Ne), and argon (Ar), are generated, without generating radicals and ions of the source materials, and must carry energy to the surface of the substrate. Because radicals and ions of source materials cause vapor phase reactions or react the instant they arrive at the substrate surface, selectivity is lost, thereby preventing polycrystalline growth. For these reasons, the generation of such radicals and ions within a plasma must be avoided at all costs. The source materials are carried to the surface of the growing film in an inactive state and become adsorbed there. Subsequently, if energy for reaction is supplied, such as by a dilute gas, a polycrystalline film will be formed in the as-deposited state. Consequently, dilution of the source gas is desired, and this gives rise to the necessity of selecting as the dilution gas a gas that promotes reaction of the source materials on the substrate surface. It goes without saying that the noble gas elements are composed of individual atoms, and, for this reason the ionization potential spectrum is very simple. For example, the monovalent ionization potential of helium is 24.587 eV, while the divalent ionization potential is only 54.416 eV. Further, the monovalent ionization potential of neon is 21.564 eV, while the divalent ionization potential is 40.962 eV. The monovalent ionization potential of argon is 15.759 eV, while the divalent ionization potential is 27.629 eV, and the trivalent ionization potential is 40.74 eV. Therefore, when a small amount of source materials is diluted in helium and a plasma is generated, most of the ionized helium will be 24.587 eV monovalent ions. When a small amount of source materials are diluted in neon and a plasma is generated, the neon will be ionized into mainly monovalent ions of 21.564 eV. For argon, although both the monovalent ions and divalent ions are dominant, argon radicals and ions are effectively generated even when the source material is not diluted by a large amount of argon because the ionization energy is relatively low. In contrast to this, there is hydrogen, widely used as a dilution gas in the prior art, in which more than ten different ionization potentials exist between 15 eV and 18 eV for the ionization potential of the hydrogen molecules. For this reason, in contrast to noble gas elements such as helium which form plasmas containing one or two energies (laser light if referred to in terms of light), molecular gases such as hydrogen form plasmas containing a mixture of energies (white light if referred to in terms of light). Just as laser light will transport energy more effectively than white light, energy is transported to the substrate surface more effectively when the source gas is diluted by a noble gas element. In addition to the noble gas elements of helium, neon and argon, krypton (Kr) and xenon (Xe) may of course also be used as dilution materials during the deposition of semiconductor films. On the other hand, since VHS and microwave plasmas have high average electron temperatures within the plasma, the radical generation efficiency can be increased at relatively low power. In other words, since high power is not necessary, these plasmas generate few high energy ions, and resulting film damage is kept to a minimum. Further, a high radical generation efficiency also increases the film growth rate. If this invention were also carried out using the 13.56 MHz rf plasma used widely in the prior art, the film formation rate would be extremely slow, less than several Å/min, making it absolutely unsuitable for utilization. Moreover, a very slow film formation rate will be harmful, reducing the quality of the film. Which is to say that it is precisely because VHF plasmas and microwave plasmas are used that this invention can be attained. In this sense, this invention can be very easily achieved by also using microwave PECVD, having a frequency an integer multiple of 2.45 GHz. And with such systems, there is an even greater degree of freedom in film formation conditions than in VHF-PECVD, meaning a semiconductor film with even better crystallinity can be deposited with greater ease.

2-13, Optimum Film Thicknesses for VHF-PECVD and Microwave PECVD As-Deposited Films)

When placing a film in the polycrystalline state immediately after deposition (as-deposited) using VHF-PECVD or microwave PECVD, the film quality for film thicknesses ranging from 0 to 500 Å will be extremely poor compared to normal crystallized films. The film will consist of small, island-shaped crystalline grains in a sea of amorphous material, have a very low degree of crystallinity, and contain a large number of defects. From 500 Å to 1000 Å, the ratio of crystal grains to the amorphous material will increase. From about 1000 Å to 1500 Å, the semiconductor surface will be generally covered with crystal grains; and the amorphous components on the surface will almost disappear. From about 1500 Å to 2000 Å, the size of the crystal grains will gradually increase along with the film thickness. At 2000 Å or higher, the film will grow while the crystal grains maintain approximately the same shape. The film thickness dependency of the transistor properties will also change in response to changes in the film quality relative to the film thickness. At 2000 Å or higher, because the film quality will exhibit virtually no change (because there is almost no thin film degradation), the thin film effect is active; and the thinner the film, the better the transistor properties become. At film thicknesses of 2000 Å to 1500 Å, thin film degradation will begin to take effect. Yet, as before, the thin film effect will remain dominant. Although this will be more lax than at 2000 Å or higher, even here, the thinner the film the better the transistor properties become. Between 1500 Å and 200 Å, thin film degradation and the thin film effect become competitive and transistor properties in the on condition reach their maximum values. With a film thickness of less than 200 Å, thin film degradation overcomes the thin film effect, and the thinner the film, the poorer the transistor properties. Put another way, in the case of this invention, transistor properties are the best at semiconductor film thicknesses from 200 Å to 1500 Å, but ideally between 400 Å to 1300 Å. Until this point, the discussion has been about transistor properties in the on state; but the leak current will also vary with the thickness of the film. The principles of off state leakage in thin film semiconductor device are not well understood. In this invention, the principles are unclear; but, if the film thickness is 1000 Å or more, there is a strong positive correlation between the film thickness and off state leakage. The thicker the film, the larger the off state leakage. If the film thickness is less than 1000 Å, the correlation weakens and becomes independent of the off state leakage. In other words, between 0 and 1000 Å, the off state leakage current is almost consistently at a minimum. Consequently, the on state transistor properties are best, and the film thicknesses in which the off state leakage is the smallest are from 200 Å to 1000 Å, but ideally from 400 Å to 1000 Å. When the thin film semiconductor device of this invention is used in an LCD, it is desirable to consider the effects of light exposure on the off state leakage current. Light exposure will cause an increase in the off state leakage current in thin film semiconductor devices. This is called the optical leakage current. Having a sufficiently small optical leakage current is a condition for a good thin film semiconductor device. In the case of the thin film semiconductor device of this invention, the optical leakage current is proportional to the film thickness. From the perspective of reliable production and optical leakage current coexisting, it is desirable to have a film thickness from about 100 Å to 800 Å. In a case in which the off state leakage and optical leakage are important, such as when using a thin film semiconductor device for the pixel switching element of an LCD, it is desirable to have a semiconductor film thickness from 100 Å to 700 Å. Moreover, when it is necessary to give even stronger consideration to on current, the optimum thickness is from 200 Å to 800 Å. A system that would satisfy all conditions would have a thickness from 400 Å to 800 Å, but ideally from 600 Å to 800 Å. Further, it is normally quite difficult to activate implanted ions in the source and drain regions at a low temperature of 350° C. or lower as happens with this invention. This is the reason that to carry out activation in a stable manner, a lower limit must be set for the semiconductor film thickness. With this invention, the desired value is 300 Å or higher. If an LDD structure is to be utilized, a thickness of 500 Å or higher is desired.

2-14, Crystallization of the Semiconductor Film through VHF-PECVD and Microwave PECVD As described in detail in section (2-12), although a polycrystalline film in the as-deposited state can be obtained easily using VHF-PECVD, the film quality is not as good as a crystallization film. On the other hand, it is difficult to crystallize a film obtained from the normal PECVD process as long as it has not been dehydrogenated or carefully annealed. In contrast, a semiconductor film from VHF-PECVD or microwave PECVD can be very easily crystallized using RTA or VST-SPC, or be melt crystallized such as by laser irradiation. Since most of the film will already be in an as-deposited crystalline state and residual amorphous components will be limited, crystallization of residual amorphous components can be achieved by means of a relatively low energy supply. Also, even when melt crystallization progresses using high energy, the polycrystalline components play the role of preventing the evaporation and scattering of semiconductor atoms. Thus, crystallization can proceed smoothly without semiconductor film damage, surface roughness, material loss and other problems. Ultimately, it can be said that rather than having a film obtained through the VHF-PECVD process or the microwave PECVD process as the active area of a thin film semiconductor device in the as-deposited state, it is more suitable to have such a film be the first semiconductor layer when producing low temperature poly—Si TFTs in which the highest temperature of the process step is 350° C. or lower using melt crystallization. Put differently, a high-performance thin film semiconductor device can be produced by forming a semiconductor film on top of an insulating substance using the VHF-PECVD process or the microwave PECMD process and then crystallizing this film using solid phase crystallization, such as RTA or VST-SPC, or crystallizing it using melt crystallization, such as by laser irradiation, and then having the subsequent process steps take place at 350° C. or lower.

Films deposited by VHF-PECVD or by microwave PECVD have quality closer to that of films deposited using LPCVD than to films deposited by PECVD. For this reason, the relationship between the transistor properties and semiconductor film thickness obtained when producing a thin film semiconductor device through crystallization becomes equivalent to the relationship possessed by a thin film semiconductor device produced by the LPCVD process. In contrast to semiconductor films produced by the LPCVD process, however, which show almost no reduction in film thickness before and after crystallization, some slight reduction can be found in VHF-PECVD and microwave PECVD films. Therefore, when crystallizing such films to produce thin film semiconductor devices, the discussion in section (2-6) can be applied as is by considering the semiconductor film thickness after crystallization to be the same as the film thickness of a film from the LPCVD—crystallization method.

As discussed in the foregoing, using this invention, high-quality semiconductor films comprised of polycrystalline silicon films and others can be easily formed at low temperatures of less than about 450° C. and 430° C. or lower. Thus, this invention greatly improves the properties of thin film semiconductor devices as well as brings about reliable mass production. To be specific, it has the effects that are described below.

Effect 1). Since the processing temperatures are below about 450° C., low-cost glass can be used and it is possible to lower the price of the products. Additionally, since it is possible to prevent the warpage of the glass under its own weight, it is easily possible to increase the size of liquid crystal displays (LCDs).

Effect 2). Since the processing temperatures are approximately 350° C. or less, there is no thermal degradation of the underlevel insulator layer or gate insulator layer; and it is possible to easily produce high-performance thin film semiconductor devices with excellent reliability.

Effect 3). Laser irradiation can be applied uniformly over the entire substrate. The result of this is that the uniformity of each lot is improved, and reliable production has become possible.

Effect 4). The formation of self-aligned TFTs in which the gate electrode is aligned with the source and drain by ion doping and subsequent low temperature activation at approximately 300° C.~350° C. has become remarkably easy. As a result, it has become possible to reliably activate impurity ions. Additionally, it has become possible to easily and reliably fabricate lightly doped drain (LDD) TFTs. Because LDD TFTs have been realized by low temperature process poly—Si TFTs, it has become possible to decrease TFT element size and off leak currents.

Effect 5). In the prior art, only low temperature poly—Si TFTs having $SiO_2$ made by ECR-PECVD showed good transistor characteristics. Using this invention, however, this has become possible using conventional PECVD reactors. Consequently, practical gate insulator layer fabrication equipment applicable to large substrates and suitable for mass production has been achieved.

Effect 6). Thin film semiconductor devices with higher on currents and lower off currents than those produced by the prior art have been obtained. Additionally, the non-uniformity in these values has been decreased.

Effect 7). When using low price, conventional glass, it has become possible to form underlevel protection layers which effectively prevent the incorporation of impurities from the substrate into the semiconductor film and simultaneously act as the underlevel protection layer for thin film semiconductor devices showing optimum electrical properties. Also, the degradation of the electrical properties of thin film semiconductor devices as a result of stress from the underlevel protection layer and the generation of cracks in the thin film semiconductor devices have been avoided.

Effect 8). The incorporation of constitutive elements such as fluorine (F) and carbon (C) from cleaning vapors into the semiconductor films when such films are formed by plasma enhanced chemical vapor deposition (PECVD) has been prevented. As a result, the amount of impurities among substrates can always be kept to a minimum and it has become possible to reliably fabricate excellent thin film semiconductor devices.

Effect 9). Even when depositing semiconductor films by low pressure chemical vapor deposition (LPCVD) at low temperatures less than about 450° C., it has become possible to simultaneously achieve uniformity, both within a single substrate and among different substrates, and a suitable deposition rate. Therefore, it is possible to accommodate increasing substrate size; and it has become possible to mass produce large-area LCDs.

Effect 10). Three types of variation in electrical properties of thin film semiconductor devices are recognized: variation within a single substrate, variation among substrates within the same lot, and variation from lot to lot. Using this invention, however, all three types of variation can be controlled. The variation among lots processed by PECVD has been particularly significantly improved.

Effect 11). Even when the semiconductor film is grown by PECVD, good adhesion between the semiconductor film and the underlevel protection layer can be achieved. In other words, problems such as the generation of numerous crater-shaped holes in the semiconductor film and peeling of the films have been avoided.

Effect 12). Even without special crystallization processing, poly—Si TFTs can be fabricated reliably on large-area substrates by low temperature processing less than or equal to about 350° C.

THE BEST SYSTEMS FOR IMPLEMENTING THIS INVENTION

This invention is explained in further detail with reference to the accompanying figures.

EXAMPLE 1

Figure 1A:
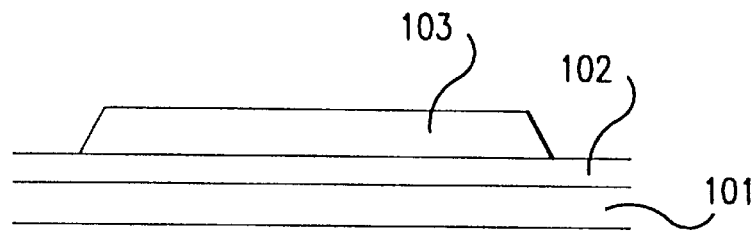
FIGS. 1(a)–(d) are element cross-sectional views for each step in the fabrication of a thin film semiconductor device showing one practical example of this invention.
Figure 1B:
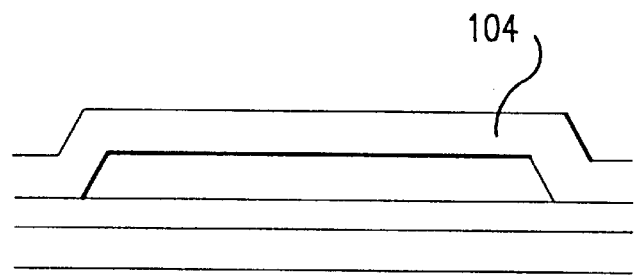
Figure 1C:
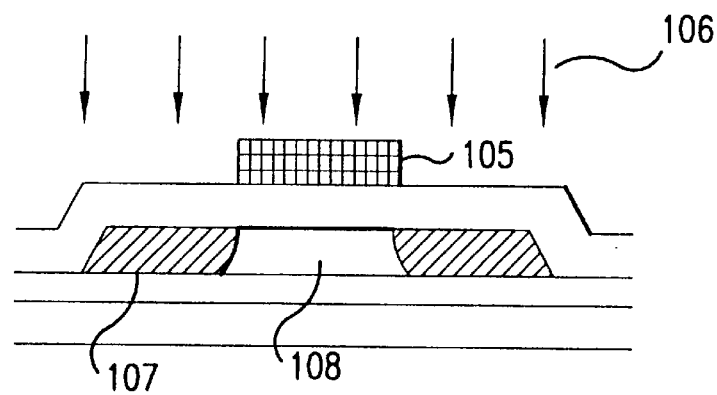
Figure 1D:
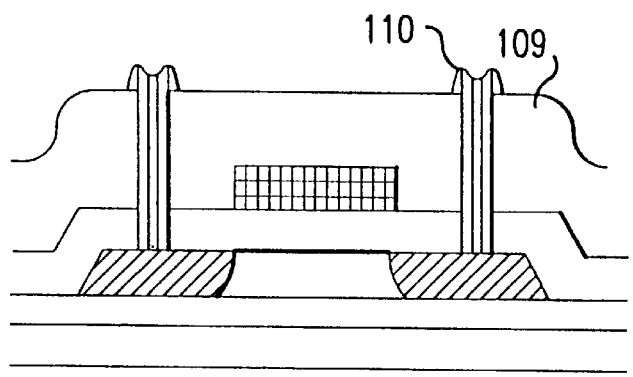
Figure 2A:
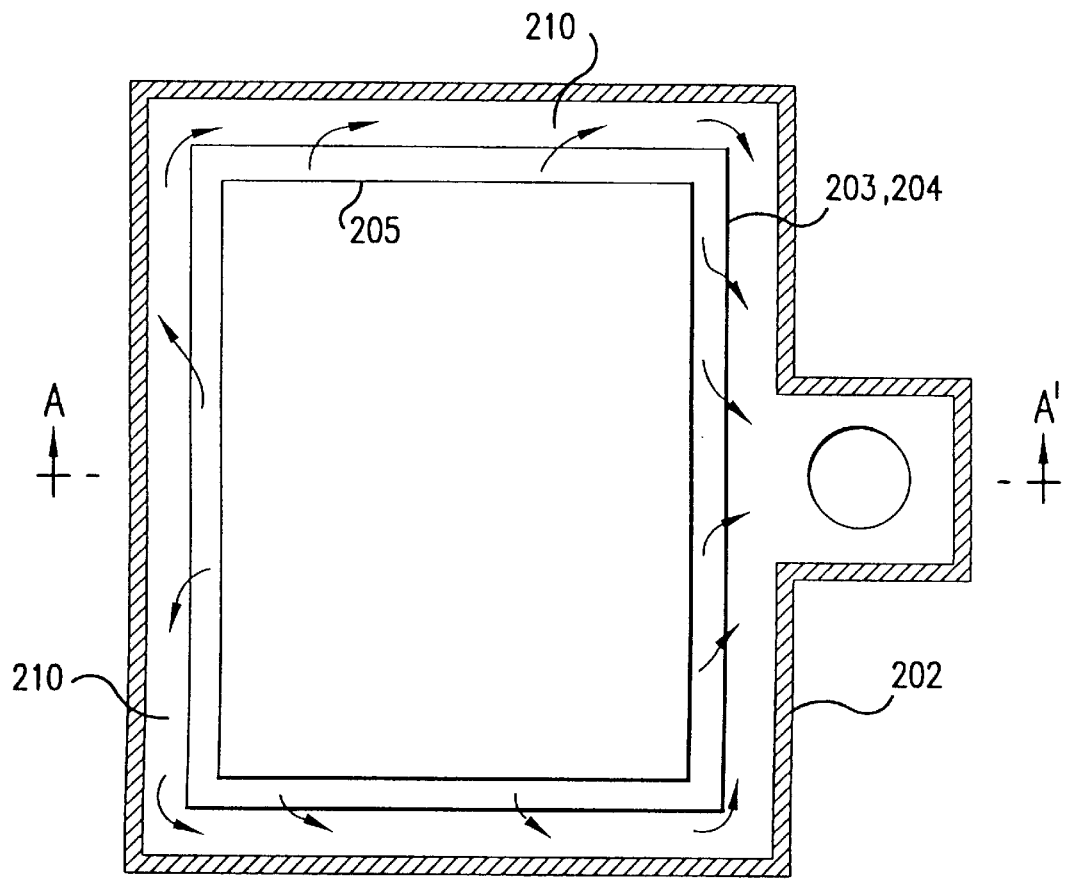
FIG. 2 shows the PECVD reactor used in this invention.
Figure 2B:
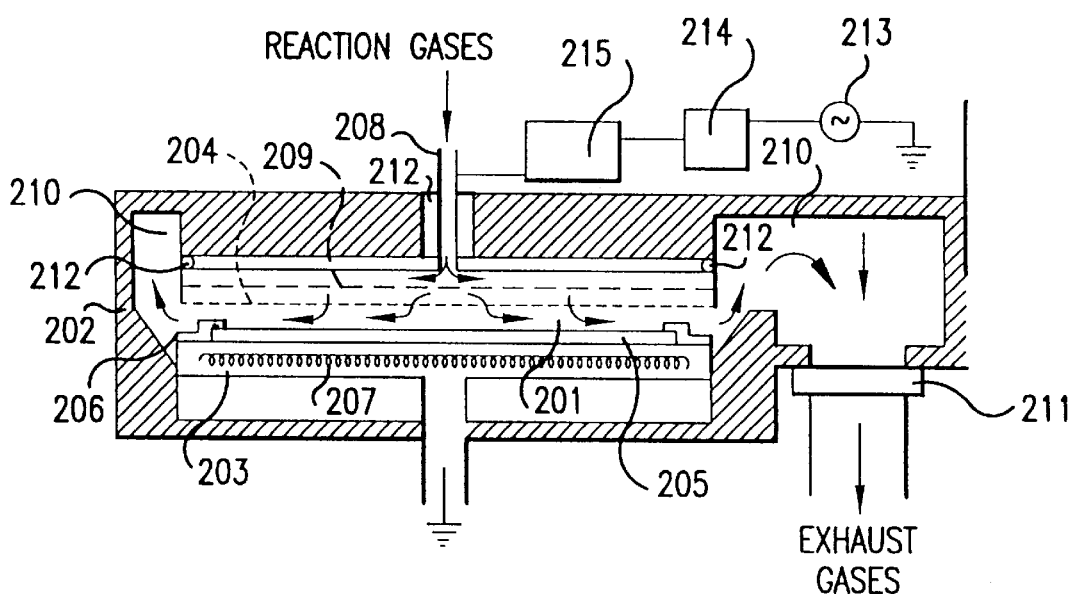
Figure 3A:
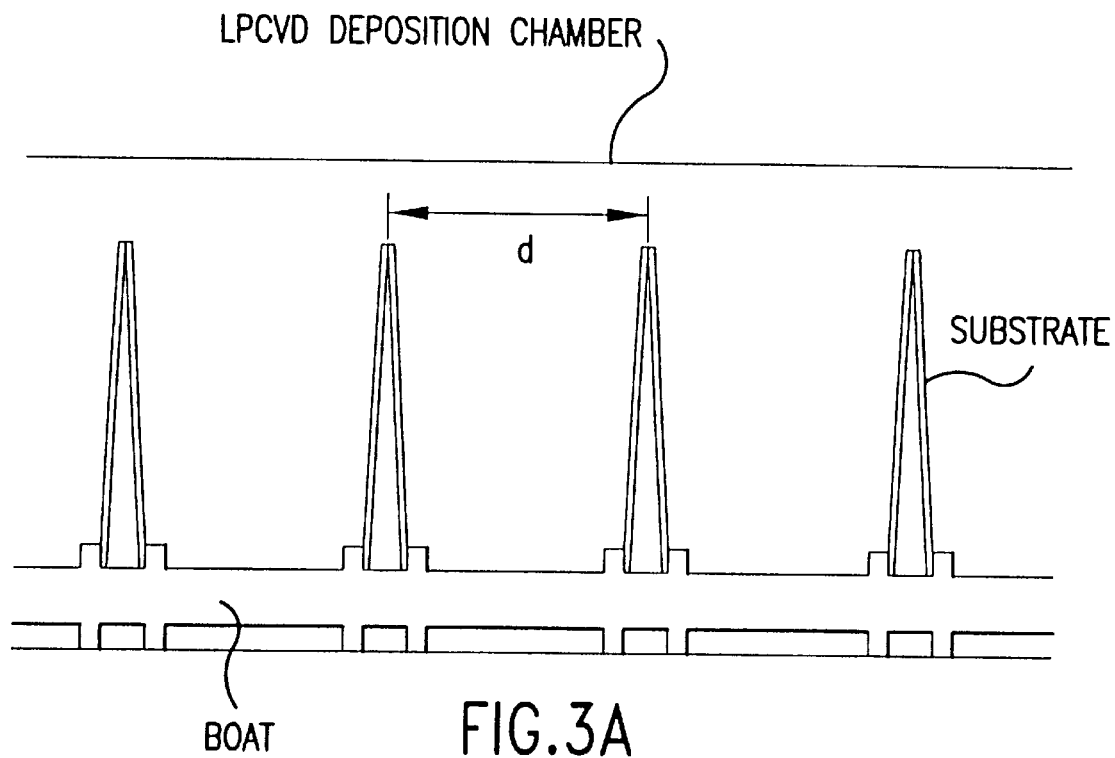
FIG. 3 shows the deposition chamber and the deposition chamber interior of the LPCVD reactor of this invention.
Figure 3B:
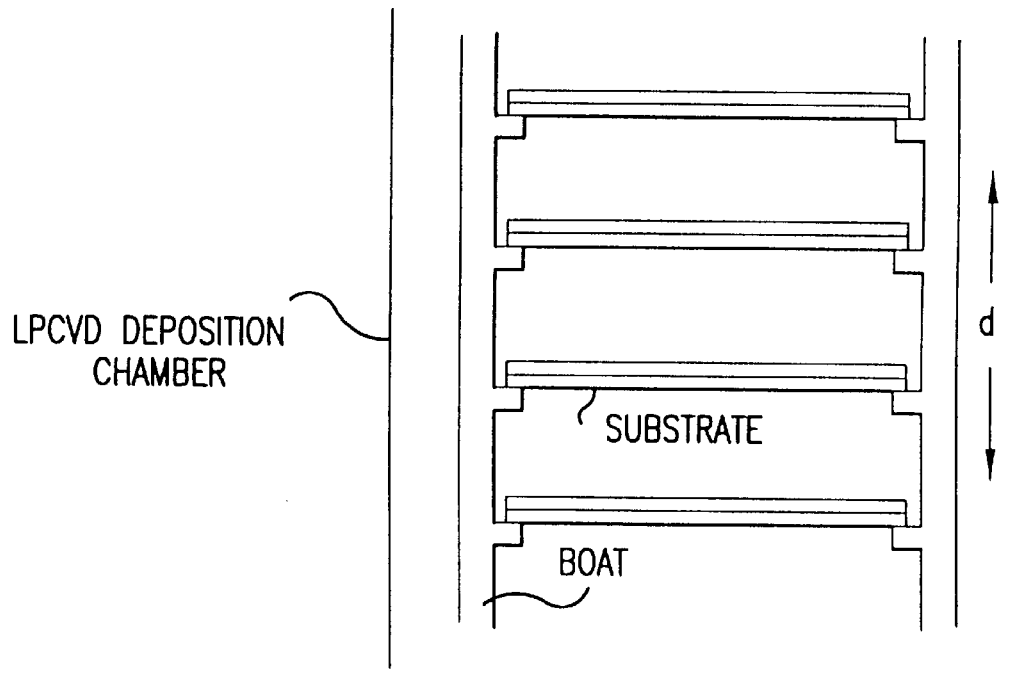
Figure 4:
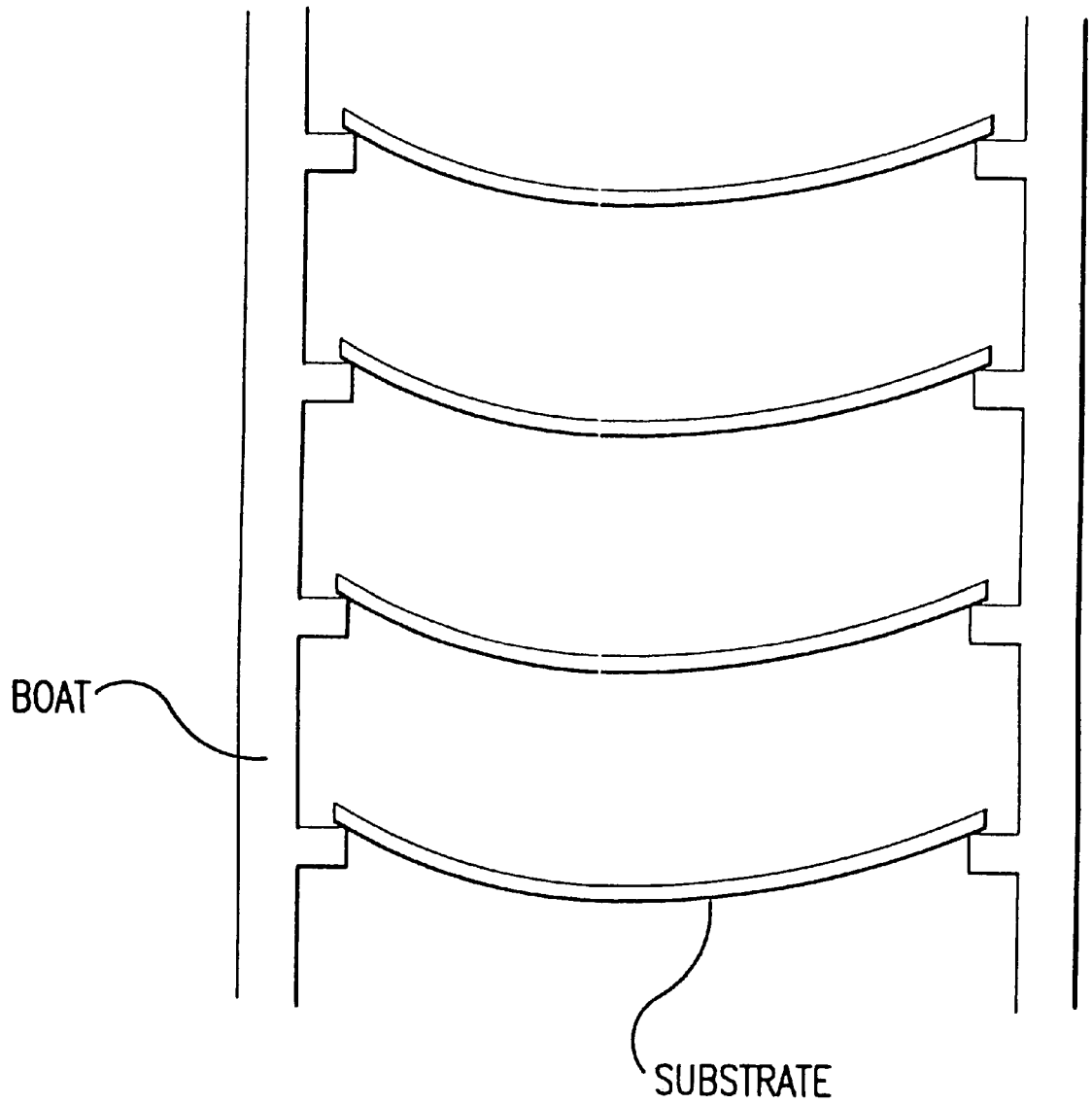
FIG. 4 explains the substrate warpage resulting from a thermal environment.
Figure 5:
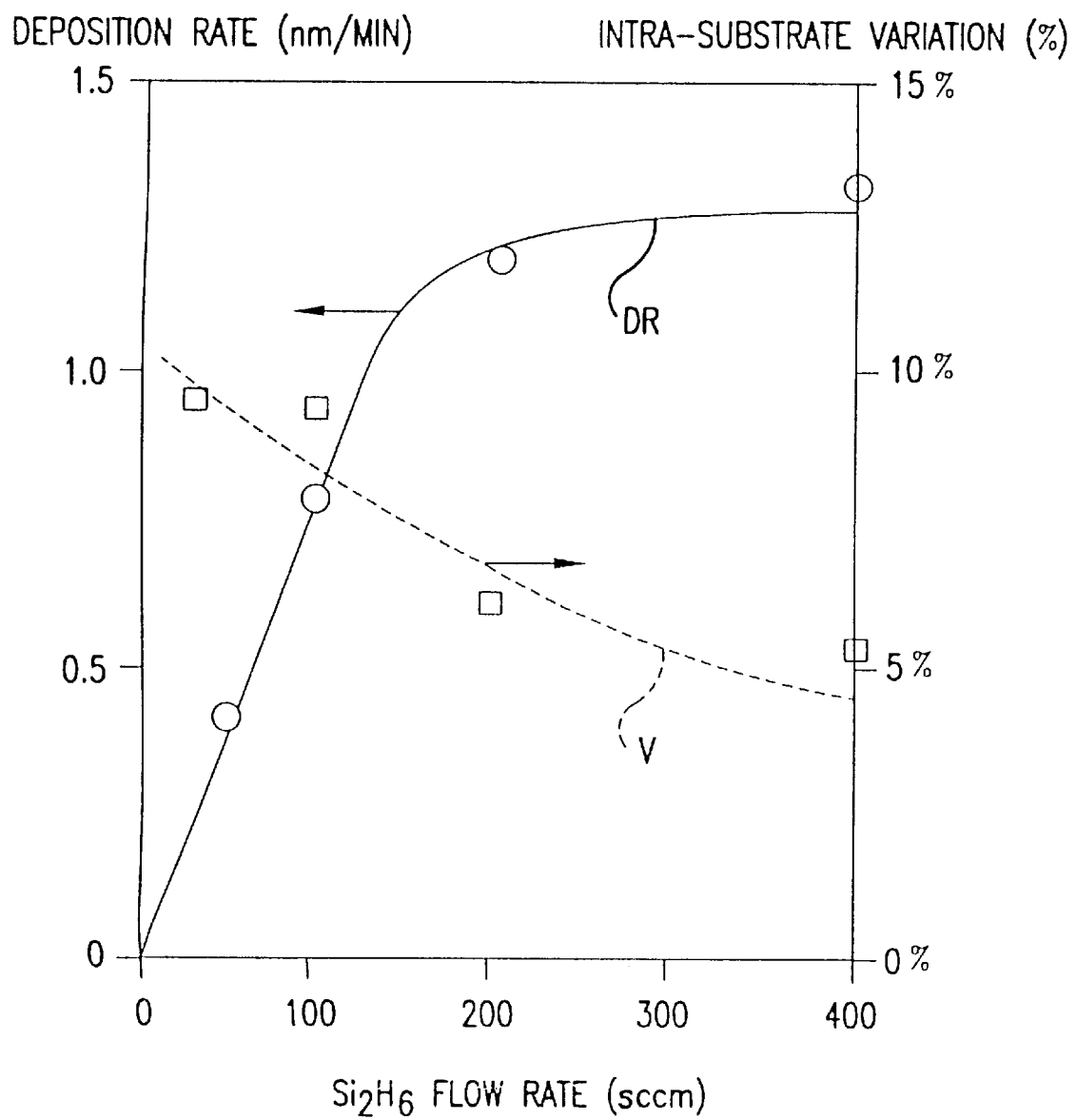
FIG. 5 explains the results of this invention.

FIGS. 1(a) through (d) show cross-sectional views of the fabrication process for a thin film MIS field effect transistor.

In Example 1, a 235 mm×235 mm sheet of non-alkaline glass (OA-2, manufactured by Nippon Electric Glass Co., Ltd.) was used for substrate 101, though the type and size of the substrate are irrelevant for any substrate able to withstand the maximum processing temperature. First, silicon dioxide film ($SiO_2$ film) 102, which serves as the underlevel protection layer, is formed on substrate 101 by means of atmospheric pressure chemical vapor deposition (APCVD), PECVD, sputtering or other means. In APCVD, the $SiO_2$ layer can be deposited using monosilane ($SiH_4$) and oxygen as source gases at a substrate temperature of between about 250° C. and 450° C. In the PECVD and sputtering methods, the substrate temperature can be anywhere from room temperature to 400° C. In Example 1, a 2000 Å $SiO_2$ film was deposited at 300° C. by APCVD using $SiH_4$ and $O_2$ as source gases.

Then, an intrinsic silicon layer, which later becomes the active layer of the thin film semiconductor device, was deposited to a thickness of approximately 500 Å. The intrinsic silicon layer was deposited over 58 minutes at a temperature of 425° C. by a high vacuum LPCVD reactor having a 200 sccm flow of disilane ($Si_2H_6$) as the source gas. The high vacuum LPCVD reactor used in Example 1 has a capacity of 184.51. Seventeen substrates were inserted face-down in the reaction chamber, which was maintained at 250° C. After the substrates were inserted, the turbomolecular pump was started. After the pump reached steady-state speed, a two-minute leak test was performed. The leak rate from outgassing and other sources at this time was $3.1 \times 10^{-5}$ torr/min. The 250° C. insertion temperature was then-raised to a deposition temperature of 425° C. over a period of 1 hour. For the first 10 minutes after heating was initiated, no gas was introduced into the reaction chamber and heating was performed in a vacuum. The ultimate background pressure reached in the reaction chamber 10 minutes after the onset of heating was $5.2 \times 10^{-7}$ torr. During the remaining 50 minutes of the heating period, nitrogen gas having a purity of at least 99.9999% was continuously introduced at the rate of 300 sccm. The equilibrium pressure in the reaction chamber at this time was 3.0 xx $10^{-3}$ torr. After the deposition temperature was reached, the source gases, $Si_2H_6$ and 99.9999% pure helium (He) for dilution, were introduced at the flow rates of 200 sccm and 1000 sccm, respectively; and the silicon film was deposited over a period of 58 minutes. The pressure immediately after $Si_2H_6$ and other gases were introduced into the reaction chamber was 767 mtorr; and the pressure 57 minutes after these source gases were introduced was 951 mtorr. Silicon films obtained in this way were 501 Å thick; and, except for the 7 mm periphery of the substrate, the thickness of the film varied less than±5 Å over the 221 mm×221 mm square region. In Example 1, the silicon layer was formed as described by means of LPCVD, but PECVD and sputtering can also be used. In the PECVD and sputtering methods, silicon film deposition temperature may be set anywhere between room temperature and approximately 350° C.

Silicon films obtained in this manner are high-purity a—Si films. Next, this a—Si layer is crystallized by irradiating it for a short period of time with either optical energy or electromagnetic energy, thereby changing it into polycrystalline silicon (poly—Si). In Example 1, the a—Si layer was irradiated using a xenon chloride (XeCl) excimer laser (wavelength of 308 nm). The laser pulse width at full-width, half maximum intensity was 45 ns. Since this irradiation time is extremely brief, the substrate is not heated when the a—Si is crystallized into poly—Si, hence substrate deformation does not occur. Laser irradiation was performed in air with the substrate at room temperature (25° C.). An 8 mm×8 mm square area is irradiated during each laser irradiation, and the irradiated area is shifted by 4 mm after each irradiation. At first, scanning is performed in the horizontal direction (Y direction), and then the substrate is then shifted 4 mm in the vertical direction (X direction). It is then moved 4 mm more in the horizontal direction, where it is again scanned. Thereafter these scans are repeated until the entire surface of the substrate has been subjected to the first laser irradiation. The energy density of this first laser irradiation was 160 $mJ/cm^2$. After the first laser irradiation was completed, a second laser irradiation was performed over the entire surface at an energy density of 275 $mJ/cm^2$. The scanning method used for the second irradiation is identical to that used for the first laser irradiation; scanning is performed while shifting the 8 mm×8 mm square irradiation area in 4 mm increments in the Y and X directions. This two-stage laser irradiation provides the means for uniformly crystallizing the a—Si to form poly—Si over the entire substrate. While an XeCl excimer laser was used as the optical energy or electromagnetic energy in Example 1, other energy sources may be used provided the energy irradiation time is less than several tens of seconds. For example, irradiation may also be performed using an ArF excimer laser, XeF excimer laser, KrF excimer laser, YAG laser, carbon dioxide gas laser, Ar laser, dye laser or other laser, as well as by an arc lamp, tungsten lamp or other light source. When using an arc lamp to irradiate the a—Si layer to transform it into poly—Si, output of about 1 $kW/cm^2$ or greater and an irradiation time of about 45 seconds is used. Even at the time of this crystallization, the energy irradiation time is short, so problems such as deformation and cracking caused by heating the substrate do not occur. This silicon film was then patterned and channel region semiconductor film 103, which becomes the active layer of the transistor, was created. See FIG. 1(a).

Next, gate insulator layer 104 is formed by means of ECR-PECVD, PECVD, or other deposition method. In Example 1, a $SiO_2$ film was used as the gate insulator layer and was deposited to a thickness of 1200 Å using PECVD. See FIG. 1(b). Immediately prior to setting the substrate in the PECVD reactor, the substrate was soaked for 20 seconds in a 1.67% dilute hydrofluoric acid solution to remove the native oxide layer from the surface of the semiconductor film. There was an interval of approximately 15 minutes from the time the oxide layer was removed until the time the substrate was loaded in the loadlock chamber of the PECVD reactor. This time interval should be as short as possible in order to preserve MOS interface cleanliness; an interval of about 30 minutes, at most, is desirable. In the PECVD method, monosilane ($SiH_4$) and nitrous oxide ($N_2O$) were used as source gases to form the gate insulator layer at a substrate temperature of 300° C. A 900 W rf plasma at 13.56 MHz was generated at a pressure of 1.5 torr. The $SiH_4$ flow rate was 250 sccm and the $N_2O$ flow rate was 7000 sccm. The $SiO_2$ deposition rate was 48.3 Å/s. Immediately before and after the $SiO_2$ layer was formed under these conditions, the silicon layer and deposited oxide layer were exposed to an oxygen plasma to improve the MOS interface and the oxide film. While monosilane and nitrous oxide were used as source gases in Example 1, an organic silane, such as TEOS ($Si-(O-CH_2-CH_3)_4$), and an oxidizing gas, such as oxygen, could also be used. In addition, although a general-purpose PECVD reactor was used here, naturally, ECR-PECVD could also be used to form the insulator layer. Regardless of the type of CVD reactor or source gases used, it is desirable that the insulator layer formation temperature be 350° C. or less. This is important for preventing thermal degradation of the MOS interface and gate insulator layer. The same thing applies to all processes-described below. All process temperatures after gate insulator layer deposition must be kept to 350° C. or less. Controlling the process temperature in this way enables high-performance thin film semiconductor devices to be fabricated easily and reliably.

Next, a thin film, which becomes gate electrode 105, is deposited by such means as sputtering, evaporation, or CVD. In Example 1, tantalum (Ta) was selected as the gate electrode material and was deposited to a thickness of 5000 Å by means of sputtering. The substrate temperature during sputtering was 180° C., and argon (Ar) containing 6.7% nitrogen ($N_2$) was used as the sputtering gas. The optimum nitrogen concentration in the argon is from 5.0 to 8.5%. The tantalum film obtained under these conditions is mostly α-Ta with a resistivity of 40 $\mu\Omega$cm. Therefore, the sheet resistivity of the gate electrode in Example 1 is 0.8 $\mu$/square.

Patterning is carried out after the thin film which becomes the gate electrode is deposited. Then impurity ions 106 such as phosphorous were implanted using a bucket-type non-mass-separating ion doping apparatus (ion doping) to form source and drain regions 107 and channel region 108 in the intrinsic silicon layer. See FIG. 1(c). In Example 1, the objective was to fabricate NMOS TFTS, so implantation was carried out to $5 \times 10^{15}$ 1/cm² using hydrogen-diluted 5% phosphine ($PH_3$) source gas at a high frequency power of 38W and an acceleration voltage of 80 kV. A suitable value ranging from about 20W to 150W was used for the high frequency power. During PMOS TFT fabrication, implantation was carried out to about $5 \times 10^{15}$ 1/cm² using a hydrogen-diluted 5% diborane ($B_2H_6$) source gas, a high frequency power of between 20W to 150W, and an acceleration voltage of 60 kV. When fabricating CMOS TFTs, the NMOS and PMOS are alternately covered with a mask of suitable material, such as polyimide resin; and ions are implanted into each using the method described above.

Next, interlevel insulator layer 109 was deposited to 5000 Å. In Example 1, the interlevel insulator layer was formed by PECVD using $SiO_2$. In the PECVD method, the interlevel insulator layer was formed at a substrate temperature of 300° C. using TEOS ($Si-(O-CH_2-CH_3)_4$) and oxygen ($O_2$) as source gases. An 800W rf plasma at 13.56 MHz was generated at a pressure of 8.0 torr. The TEOS flow rate was 200 sccm, and the $O_2$ flow rate was 8000 sccm. The deposition rate for the $SiO_2$ film at this time was 120 Å/s. After ions were implanted and the interlevel insulator layer was formed, thermal annealing was performed for 1 hour at 300° C. in an oxygen atmosphere to achieve activation of implanted ions and densification of the interlevel insulator layer. The desired temperature of this thermal annealing is between 300° C. and 350° C. Contact holes are opened after thermal annealing is performed, and source and drain electrodes 110 are formed by sputtering or other means to complete the thin film semiconductor device. See FIG. 1(d). Indium tin oxide (ITO) and aluminum. (Al) and the like are used for source and drain electrodes. The temperature of the substrate during sputtering of these conductors is in the approximate range of 100° C. to 250° C.

The transistor characteristics of the thin film semiconductor devices that were experimentally fabricated in this way were measured. It was found that $I_{ON}=(23.3+1.73, -1.51) \times 10^{-6}$ A at a 95% confidence level. Here, the on current, $I_{ON}$, is defined as the source-drain current Ids when transistors are turned on at source-drain voltage of Vds=4 V and gate voltage of Vgs=10 V. The off current when the transistor was turned off at Vds=4 V and Vgs=0 V was $I_{OFF}=(1.16+0.38, -0.29) \times 10^{-12}$ A. These measurements were taken at a temperature of 25° C. for transistors having channel length L=10 $\mu$m and width W=10 $\mu$m. The effective electron mobility (J. Levinson et al. J. Appl. Phys. 53, 1193'82) found from the saturation current region was $\mu=50.92\pm3.26$ cm²/v.sec. Conventional low temperature process poly—Si TFTs have $I_{ON}=(18.7+2.24, -2.09) \times 10^{-6}$ A, and $I_{OFF}=(4.85+3.88, -3.27) \times 10^{-12}$ A. As described, this invention achieves for the first time, by means of a low temperature process in which a maximum processing temperature of 425° C. or less is maintained for no more than several hours, extremely good and uniform thin film semiconductor devices that have high mobility, low variation, and Ids that changes seven orders of magnitude or more for a gate voltage change of 10 V. As described previously, the uniformity of laser crystallization, whether within a single substrate or from lot to lot, has been a serious problem. This invention, however, greatly reduces variation of both on current and off current. The improvement over existing technologies in off current uniformity is particularly marked; and when thin film semiconductor devices fabricated as described by this invention are applied to LCDs, a uniform, high-quality picture is obtained over the entire LCD screen. Moreover, improved uniformity means that the initial silicon film is stable with respect to variations in the laser source; thus, this invention also effects conspicuous improvement with respect to variations among production lots. As described, this invention achieves extremely reliable crystallization of silicon through the use of energy irradiation, such as laser irradiation. Tests performed by the inventor verified that when the initial silicon layer was formed at low temperature of less than 450° C. and at a silicon layer deposition rate of more than approximately 2 Å/min, the silicon layer was stable with respect to variations of the laser and, moreover, that thin film semiconductor devices having good transistor properties are fabricated even when a $SiO_2$ layer not formed by ECR-PECVD is used as the gate insulator layer. In addition, poly—Si layers obtained by this method are also stable with respect to lightly doped drain (LDD) structure formation by means of ion doping, as is described later, and are easily activated. This is indirectly related to the fact that a—Si layers formed under these conditions are perfectly amorphous without microcrystalline grains, and that the components that make up the a—Si layer are made of large regions. Because the a—Si layer does not contain microcrystallites, the crystallization that accompanies energy irradiation progresses uniformly within the irradiated region. At the same time, because the a—Si layer is composed of large regions, the size of the grains after crystallization is large and high-performance electrical characteristics can be obtained. In other words, ideal a—Si films can be obtained by optimizing the deposition conditions for the initial a—Si layer; and uniform, high-quality poly—Si films can be obtained by crystallizing this initial a—Si layer. Amorphous silicon films formed using technology of the prior art suffered from the problems described above, as no heed was paid to the quality of the a—Si layer; for example, deposition temperature in the LPCVD process was about 550° C., and substrate temperature in the PECVD method was in the neighborhood of 400° C. One more important point of this invention is that the process temperature after poly—Si film formation is held to 350° C. or less. By controlling the temperature in this way, MOS interface and insulator layer quality can be stabilized. In this sense, this invention, as shown in FIG. 1, is especially useful for top-gate TFTs. In the case of bottom-gate TFTs, the silicon layer is deposited after the gate insulator layer has been formed and, moreover, is later subjected to crystallization by laser irradiation or other means. Therefore, part of the MOS interface and gate insulator layer is, of necessity, exposed, albeit for a brief time, to a high-temperature thermal environment of nearly 1000° C. This thermal environment not only roughens the MOS interface but also alters the chemical composition and chemical bonds of the insulator layer in the vicinity of the MOS interface, thus causing transistor characteristics to deteriorate and triggering the problem of increased non-uniformity.

EXAMPLE 2

Other examples of implementations of this invention will also be explained using FIGS. 1(a) through (d).

In Example 2, sheets of non-alkaline glass (OA-2 manufactured by Nippon Electric Glass Co., Ltd.) measuring 300 mm×300 mm and crystallized glass (TRC-5 manufactured by Ohara) measuring 300 mm×300 mm were used for substrate 101. The strain point of OA-2 is approximately 650° C. TRC-5, on the other hand, is a crystallized glass, so the strain point cannot be defined. Since absolutely no substrate deformation or warpage can be detected up to a temperature of about 700° C., however, the strain point of TRC-5 can, in practice, be said to be above about 700° C. First, silicon oxide film 102, which becomes the underlevel protection layer, was deposited by PECVD onto substrate 101. The silicon oxide film was deposited under the same conditions that the gate insulator layer was deposited in Example 1. The thickness of the silicon oxide film was 300 nm, and the center line mean surface roughness was 0.98 nm. As with the gate insulator layer in Example 1, the underlevel protection layer surface was exposed to an oxygen plasma for 15 seconds both immediately before and immediately after oxide film deposition.

An intrinsic silicon layer, which later becomes the active layer of the thin film semiconductor device, was then deposited to approximately 500 Å. Just as in Example 1, the intrinsic silicon layer was deposited by the high vacuum LPCVD reactor described in section (2-3). The source gas, disilane ($Si_2H_6$), was introduced at a flow rate of 400 sccm; and deposition occurred at a temperature of 425° C. and a pressure of 320 mtorr. The deposition rate was 1.30 nm/min. Thirty-five OA-2 substrates and 35 TRC-5 substrates were placed in the deposition chamber, which was maintained at 250° C. Each OA-2 substrate was paired back-to-back with a TRC-5 substrate. The TRC-5 substrates were placed face-down and the OA-2 substrates were placed faceup on top of the TRC-5 substrates. There was a 10 mm space between substrate pairs. The area of the region in the deposition chamber over which the semiconductor film was deposited was 88262 $cm^2$, and the disilane flow rate per unit area was $4.53 \times 10^{-3}$ sccm/$cm^2$. After the substrates were placed in the chamber, the chamber was heated over a period of one hour from the 250° C. insertion temperature to the 425° C. deposition temperature; and, after thermal equilibrium was achieved at 425° C., the silicon layer was deposited over 40 minutes. The pressure during film deposition was maintained at 320 mtorr by the LPCVD reactor's pressure control unit. The thickness of the silicon films deposited in this manner was 52.4 nm.

Next, these a—Si films were exposed briefly to optical energy or electromagnetic energy to melt crystallize the a—Si and transform it into polysilicon (poly—Si). A xenon chloride (XeCl) excimer laser (wavelength of 308 nm) was also used in Example 2. The substrates were soaked for 20 seconds in a solution of 1.67% hydrofluoric acid immediately prior to laser irradiation to remove the native oxide layer from the surface of the semiconductor layer. There was a time interval of approximately 20 minutes after the oxide layer was removed and before laser irradiation. After the semiconductor layer was crystallized, poly—Si TFTs were fabricated by the low temperature process using exactly the same process as described in Example 1.

The transistor characteristics of the thin semiconductor devices experimentally fabricated in this way were measured. It was found that on current was $I_{ON}=(41.9+2.60, -2.25) \times 10^{-6}$ A at a 95% confidence level. Off current was $I_{OFF}=(6.44+2.11, -1.16) \times 10^{-13}$ A. The measurement conditions here were the same as the conditions in Example 1. Effective electron mobility was $\mu=90.13 \pm 4.61$ $cm^2$/v.sec. Extremely good thin film semiconductor devices were fabricated reliably using a simple process.

EXAMPLE 3

After forming the poly—Si⁻ layer using the method described in detail in Example 1, an $SiO_2$ layer corresponding to the gate insulator layer described in detail in Example 1 was deposited without patterning this poly—Si layer, and impurity ions such as $PH_3$ were implanted in the poly—Si layer by ion doping, details of which were explained in Example 1. The thicknesses of the poly—Si layer and $SiO_2$ layer and the conditions under which they were deposited were exactly the same as they were in Example 1. Impurity ion implantation conditions were also the same as those described in Example 1 except that the implantation dose was $3 \times 10^{13}$ $cm^{-2}$. Example 3 corresponds to the formation of the LDD region in TFTs explained in Example 1. After phosphorous ions were implanted, thermal annealing was performed at 300° C. in oxygen for one hour, again just as in Example 1. After that the insulator layer was stripped off and the sheet resistance of the n-type poly—Si layer that contained phosphorous ions was measured. Sheet resistance of a 221 mm×221 mm square region excluding the 7 mm periphery of the substrate was (14±2.6) kg/square at a confidence level of 95%. In the prior art, as reported on page 437 is of SSDM '93 (solid state Devices and Materials 1993), activation was not possible without adding a special process such as hydrogen implantation. Moreover, the sheet resistance value at that time was high, 50 kg or more, and its variation was 10 kg or more. In contrast, this invention allows a low-resistance LDD region to be simply formed using ion doping and makes it possible to achieve resistance variation of no more than one-quarter that of the past.

EXAMPLE 4

In Example 4, the underlevel protection layer and semiconductor layer were formed sequentially by means of PECVD using 13.56 MHz rf waves. Crystallization was then performed to fabricate the thin film semiconductor device.

Substrate 101 was a 360 mm×465 mm×0.7 mm sheet of non-alkaline glass. Prior to placement of the glass substrate in the PECVD reactor, the thin film that formed in the deposition chamber during deposition of the thin film on the previous substrate is removed from the deposition chamber. In other words, the deposition chamber is cleaned for 15 seconds. The cleaning conditions were rf power of 1600W (0.8 W/cm$^2$), electrode separation distance of 40 mm, NF$_3$ flow rate of 3200 sccm, argon flow rate of 800 sccm, and pressure of 1.0 torr. Next, after a vacuum is pulled for 15 seconds, a silicon nitride layer, which serves as the passivation layer, is deposited for 15 seconds in the deposition chamber. The deposition conditions were rf power of 300W (0.15 W/cm$^2$), electrode separation distance of 40 mm, pressure of 1.2 torr, nitrogen flow rate of 3500 sccm, ammonia flow rate of 500 sccm, and monosilane flow rate of 100 sccm. After a vacuum is pulled for 15 seconds, the substrate is placed in the deposition chamber. It takes approximately 10 seconds for the substrates that are set up in the loadlock chamber to be positioned in the deposition chamber. A stabilization period of 30 seconds is allowed before the next underlevel protection layer is deposited. All process parameters for the stabilization period are identical to the deposition conditions for the underlevel protection layer, except that plasma is not generated. The lower plate electrode temperature, from the underlevel protection layer to the deposited semiconductor film, is 360° C.; and the substrate surface temperature is approximately 340° C. After the stabilization period expires, the underlevel protection layer is deposited. The underlevel protection layer consists of a deposited layer of silicon nitride and a layer of silicon oxide. First, the silicon nitride layer is deposited over 30 seconds at rf power of 800W, electrode separation distance of 25 mm, pressure of 1.2 torr, nitrogen flow rate of 3500 sccm, ammonia flow rate of 500 sccm, and monosilane flow rate of 100 sccm. The silicon oxide layer is then deposited for 30 seconds at rf power of 900W, electrode separate distance of 25 mm, pressure of 1.5 torr, monosilane flow rate of 250 sccm, and N$_2$O flow rate of 7000 sccm. The nitride and oxide layers are each approximately 150 nm thick, forming an underlevel protection layer about 300 nm thick. After formation, the oxide layer is exposed to an oxygen plasma for 20 seconds. Oxygen plasma was irradiated at rf wave power of 900W (0.45 W/cm$^2$), electrode separation distance of 12 mm, pressure of 0.65 torr, and oxygen flow rate of 3000 sccm. After a vacuum is pulled for 15 seconds, the oxide layer is exposed to hydrogen plasma for 20 seconds. The hydrogen plasma conditions were rf power of 100W (0.05W/cm$^2$), electrode separation distance of 25 mm, pressure of 0.5 torr, and hydrogen flow rate of 1400 sccm. Upon completion of hydrogen plasma irradiation, the semiconductor layer is deposited over 60 seconds. The deposition conditions were rf power of 600W (0.3 W/cm$^2$), electrode separation distance of 35 mm, pressure of 1.5 torr, argon flow rate of 14 SLM, and monosilane flow rate of 200 sccm. This deposits an amorphous silicon film approximately 50 nm thick. After deposition of the semiconductor layer a vacuum is pulled for 15 seconds, and the amorphous silicon film is exposed to hydrogen plasma for 20 seconds. The hydrogen plasma is generated under the same conditions as the hydrogen plasma that was generated prior to semiconductor layer deposition. Next, after a vacuum is pulled for 15 seconds, the amorphous silicon film is exposed to oxygen plasma for 20 seconds. The conditions under which oxygen plasma is generated are the same as those under which the oxygen plasma was generated after underlevel protection layer formation except for the fact that the distance between electrodes is 45 mm. Finally, after a vacuum is pulled for 15 seconds, the substrates are removed from the deposition chamber in about 10 seconds. With this process, tact time is 6 minutes and 10 seconds, making it possible to sequentially deposit the underlevel protection layer and the semiconductor layer. After this, thin film semiconductor devices were fabricated using the exact same process as was described in Example 2.

The transistor characteristics of thin film semiconductors that were experimentally fabricated in this way were measured. It was found that on current was $I_{ON}$=(19.6+1.54, −1.49)×10$^{-6}$ A at a 95% confidence level, and that off current was $I_{OFF}$=7.23+2.76, −2.72)×10$^{-13}$ A. Effective electron mobility was $\mu$=36.83 _} 2.35 cm$^2$/v.sec. The measurement conditions correspond to those described in Example 1.

EXAMPLE 5

Next, a low temperature process (350° C. or less) for depositing, using the PECVD reactor that was explained in section (2-11), crystalline semiconductor films that do not require crystallization by laser irradiation or other irradiation means; the method of fabricating thin film semiconductor devices using this method; and the characteristics of these films will be described in detail. The substrates are prepared by the method described in section (2-1). Although the semiconductor layers and source gases described in section (2-2) are all applicable, silicon film is discussed here as an example and monosilane (SiH$_4$) is used as the source gas.

In Example 5, substrate 101 was a 360 mm×465 mm×1.1 mm sheet of non-alkaline glass (OA-2, manufactured by Nippon Electric Glass Co., Ltd.), and the SiO$_2$ layer of the underlevel protection layer was deposited to a thickness of 2000 Å by means of APCVD using SiH$_4$ and O$_2$ as source gases. The substrate temperature was 300° C.

Then, an approximately 750 Å intrinsic silicon layer, which becomes the active layer of the thin film semiconductor device, was deposited. The intrinsic silicon layer was deposited by means of a VHF-PECVD reactor, described previously in section (2-11), using a 50 sccm flow rate of monosilane (SiH$_4$) as the source gas and a 4800 sccm flow rate of argon (Ar), one of the noble gas elements, as a dilution gas. During deposition of the intrinsic silicon layer, the VHF wave power was 715W, the pressure in the reactor chamber was 0.8 torr, the distance between parallel plate electrodes was 35.0 mm, the lower plate electrode temperature was 400° C., and the substrate surface temperature was 340° C. The semiconductor layer obtained in this way is a silicon layer of high purity and is polycrystalline in the state immediately after deposition ("as-deposited"). The degree of crystallinity was measured using multiple wavelength spectroscopic ellipsometry and was found to be 78%. Usually, if the degree of crystallinity found by means of spectroscopic ellipsometry is less than 30%, the silicon layer is considered to be amorphous; if it is 70% or more, the layer is considered to be polycrystalline; and if it is between 30% and 70%, it is considered to be mixed. Hence, the film that was obtained was clearly polycrystalline in the as-deposited state. In fact, a sharp Raman shift was detected by means of Raman spectroscopy in the wave number region in the vicinity of 520 cm$^{-1}$, which indicates a crystalline state; in addition, it was observed by means of X-ray diffraction that the crystals have a relatively strong preferred orientation in the {220} direction.

Next, this silicon layer was patterned and channel area semiconductor layer 103, which becomes the active layer of the transistor, was formed, see FIG. 1(*a*). Using exactly the same processes as those that were used to fabricate the thin film semiconductor device that was explained in detail in Example 1, the gate insulator layer was formed, see FIG. 1(*b*), the gate electrode was formed, the source and drain regions and channel were formed by ion implantation, see FIG. 1(*c*), the interlevel insulator layer was formed, implanted ions were activated and the interlevel insulation layer was densified by thermal annealing, contact holes were opened, source and drain electrodes were formed, and the thin film semiconductor device was then completed, see FIG. 1(*d*). In Example 5, therefore, the maximum processing temperature after the first process, that of semiconductor layer formation, was 300° C. The temperature of the process for forming the gate insulator layer and the temperature of the thermal annealing process for implanted ion activation and interlevel insulator layer densification must not exceed a maximum temperature of 350° C. In other words, as detailed in section (2-10), to uniformly and reliably fabricate excellent thin film semiconductor devices over large areas, the maximum process temperature after the first process, that of semiconductor layer formation, must not exceed 350° C.

The transistor characteristics of the thin film semiconductor devices that were experimentally fabricated in this way were measured. It was found that $I_{ON}$=(1.22+0.11, −0.10)×10$^{-3}$ A at a 95% confidence level. Here, the on current, $I_{ON}$, is defined as the source-drain current Ids when transistors are turned on at source-drain voltage of Vds=4 V and gate voltage of Vgs=10 V. The off current when the transistor was turned off at Vds=4 V and Vgs=0 V was $I_{OFF}$=(1.18+0.35, −0.30)×10$^{-13}$ A. The measurements were taken at a temperature of 25° C. for transistors having channel length L=10 μm and width W=10 μm. The effective electron mobility (J. Levinson et al. J. Appl. Phys. 53, 1193'82) found from the saturation current region was $\mu$=3.41±0.22 cm$^2$/v.sec.

The maximum process temperature reached in Example 5 was the 400° C. lower plate electrode temperature during deposition of the semiconductor layer by means of a VHF-PECVD reactor; the substrate surface temperature at that time was 340° C. As shown by this example, poly—Si TFTs, which are a kind of crystalline thin film semiconductor device, were successfully fabricated at extremely low process temperature using a simple manufacturing method that does not require crystallization by laser irradiation or other means. While values for on current and mobility are far from those in Example 1, in which laser irradiation was employed; they are from 4 to nearly 10 times higher than the values for a—Si TFTs fabricated by conventional methods with a maximum processing temperature of 400° C. Additionally, source and drain regions in Example 5 were formed by means of ion implantation with the gate electrode used as a mask. Moreover, because implanted ions were activated at low temperatures of from 300° C. to 350° C., implanted ions from the source and drain regions essentially do not diffuse at all into the channel region. Therefore, the overlapping of gate electrodes and source and drain regions is determined by horizontal projection deviation during ion implantation, and the deviation value is not more than several hundred Å. In other words, the edges of the gate electrode and the edges of the source and drain matched extremely closely in a so-called self-aligned structure. For that reason, the parasitic capacitance between source and gate and between drain and gate is extremely small in comparison with that of a—Si TFTs. Due to these two facts, when the thin film semiconductor devices of this invention are used as pixel switching elements for an active-matrix liquid crystal display device (LCD), high-definition LCDs (LCDs having a large number of picture elements), bright LCDs (LCDs having a high aperture ratio in which storage capacitors have been reduced or eliminated), and highly-integrated LCDs (LCDs having a large number of picture elements per unit area), all of which were heretofore impossible using a—Si TFTs of the prior art, can easily be achieved.

EXAMPLE 6

Next, a low temperature process, having a maximum temperature of about 350° C. in which a microwave PECVD reactor is used to deposit crystalline semiconductor films that do not require crystallization by means of laser irradiation or other means, a method for fabricating thin film semiconductor devices using that method, and the characteristics of these thin film semiconductor devices will be described in detail. The substrate is prepared using the method described in section (2-1). The semiconductor film and source gases described in section (2-2) can all be applied, but here, for illustrative purposes, silicon film is used and monosilane (SiH$_4$) is used as the source gas.

In Example 6, a 300 mm×300 mm×1.1 mm sheet of non-alkaline glass (OA-2, manufactured by Nippon Electric Glass Co., Ltd.) was used for substrate 101, and the under-level protection layer and semiconductor layer were deposited sequentially at a substrate temperature of 100° C. by means of ECR-PECVD reactor, a type of microwave PECVD reactor. The microwaves used were 2.45 GHz. The silicon oxide layer, which is the underlevel protection layer, was deposited to 200 nm using SiH$_4$ and O$_2$ as source gases. The underlevel protection layer was deposited using an oxygen flow rate of 100 sccm, silane flow rate of 60 sccm, microwave power of 2250 w, reactor chamber pressure of 2.35 mtorr, and a deposition rate of 8.0 nm/s. After formation of the silicon oxide layer, the flow of silane to the deposition chamber was shut off and the silicon oxide layer was exposed to an oxygen plasma for 10 seconds. The pressure during oxygen plasma irradiation was 1.85 mtorr. Then, after a vacuum was pulled for 10 seconds, the under-level protection layer was exposed to a hydrogen plasma using a hydrogen flow rate of 100 sccm, microwave power of 2000W, and reaction chamber pressure of 1.97 mtorr. Next, without breaking the vacuum, an intrinsic silicon layer, which becomes the active layer of the thin film semiconductor device, was successively deposited to about 75 nm. The intrinsic silicon layer was deposited by introducing monosilane (SiH$_4$), the source gas, at the rate of 25 sccm and argon (Ar), an element in the noble gas family, as a dilution gas at the rate of 825 sccm. The film deposition conditions were microwave power of 2250W, reaction chamber pressure of 13.0 mtorr, and deposition rate of 2.5 nm/s. After deposition, the semiconductor layer was again exposed in succession to a hydrogen plasma and an oxygen plasma for the purpose of protecting the surface of the semiconductor layer and terminating dangling bonds in the semiconductor layer. The conditions under which the hydrogen plasma and oxygen plasma were generated were identical to those used for the underlevel protection layer. The semiconductor film obtained in this way is a high purity silicon layer and is polycrystalline in the state immediately after deposition (the as-deposited state). The degree of crystallinity was measured using multiple wavelength spectroscopic ellipsometry and was found to be 85%.

Next, this silicon layer was patterned and channel region semiconductor film 103, which becomes the active layer of the transistor, was formed. See FIG. 1(a). Using exactly the same processes as those that were used to fabricate the thin film semiconductor device that was explained in detail in Example 1, the gate insulator layer was formed, see FIG. 1(b), the gate electrode was formed, the source and drain regions and channel were formed by ion implantation, see FIG. 1(c), the interlevel insulator layer was formed, implanted ions were activated and the interlevel insulator layer was densified by thermal annealing, contact holes were opened, source and drain electrodes were formed, and the thin film semiconductor device was then completed, see FIG. 1(d). In Example 6, therefore, the maximum processing temperature throughout all processing steps was 300° C.

The transistor characteristics of the thin film semiconductor devices that were experimentally fabricated in this way were measured. It was found, with a 95% confidence level, that on current was $I_{ON}=(1.71+0.13, -0.12)\times 10^{-6}$ A and off current was $I_{OFF}=(1.07+0.33, -0.28)\times 10^{-13}$ A. Effective electron mobility was $\mu=4.68\pm0.20$ cm$^2$/v.sec. Measurement conditions conform to those in Example 1. Using this invention, poly—Si TFTs can be fabricated by a process in which all process temperatures are 300° C. or less and without even introducing a special crystallization step.

EXAMPLE 7

In this example, a semiconductor film obtained by VHS-PECVD was exposed to laser irradiation to achieve melt crystallization and create a thin film semiconductor device. The fabrication process was the same as that described in Example 5 except that the laser irradiation process was added immediately after the semiconductor film was deposited. The laser irradiation method used was the same as that described in Example 1, with the energy density of the first laser exposure changed to 130 mJ/cm$^2$, and the energy density of the second laser exposure changed to 240 mJ/cm$^2$.

The transistor characteristics of the thin film semiconductor devices that were experimentally fabricated in this way were measured. It was found, with a 95% confidence level, that on current was $I_{ON}=(22.4+1.70, -1.55)\times 10^{-6}$ A and off current was $I_{OFF}=(1.27+0.30, -0.26)\times 10^{-12}$ A. Effective electron mobility was $\mu=47.95\pm3.13$ cm$^2$/v.sec. Measurement conditions conform to those in Example 1.

EXAMPLE 8

In this example a semiconductor film obtained by microwave-PECVD was exposed to laser irradiation to achieve melt crystallization and create a thin film semiconductor device. The fabrication process was the same as that described in Example 6 except that a laser irradiation process was added immediately after the semiconductor film was deposited. The laser irradiation method used was the same as that described in Example 1, with the energy density of the first laser exposure changed to 150 mJ/cm$^2$ and the energy density of the second laser irradiation exposure changed to 270 mJ/cm$^2$.

The transistor characteristics of the thin film semiconductor devices that were experimentally fabricated in this way were measured. It was found, with a 95% confidence level, that on current was $I_{ON}=(39.8+2.45, -1.57)\times 10^{-6}$ A and off current was $I_{OFF}=(5.80+2.09, -1.26)\times 10^{-13}$ A. Effective electron mobility was $\mu=85.63\pm4.38$ cm$^2$/v.sec. Measurement conditions conform to those in Example 1.

EXAMPLE 9

Active matrix substrates using each of the thin film semiconductor devices obtained by the methods described in the above examples as pixel TFTs and driver circuit TFTs were manufactured. Liquid crystal panels were produced using some of these active matrix substrates. Liquid crystal display device modules were manufactured by equipping these liquid crystal panels with external peripheral drivers and a backlight unit. The performance of the TFTs themselves was high-quality, and since the manufacturing process is also reliable, it was possible to manufacture liquid crystal display devices having high display quality at low cost. In addition, the performance of TFTs was extremely high, and since the necessary driver circuits can be formed on the active matrix substrate (integrated drivers), it was possible to simplify the packaging configuration with the outside peripheral driver circuits and achieve a compact, lightweight liquid crystal display device.

These types of liquid crystal display devices were installed in the case of a full-color notebook PC, thus achieving at low cost the manufacture of a compact, lightweight full-color notebook PC having good display quality.

POSSIBLE INDUSTRIAL APPLICATIONS

As stated above, the method of fabricating thin film semiconductor devices described by this invention enables the manufacture of high performance thin film semiconductor devices using a low temperature process in which inexpensive glass substrates can be used. Therefore, applying this invention to the manufacture of active matrix liquid crystal display devices permits large-size, high-quality liquid crystal display devices to be manufactured easily and reliably. Moreover, when this invention is applied to the manufacture of other electronic circuits, high-quality electronic circuits can also be manufactured easily and reliably. Additionally, since the thin film semiconductor device of this invention is both low-cost and high-performance, it is optimum for active matrix substrates for active matrix liquid crystal displays. It is especially well-suited for integrated driver active matrix substrates, which require high performance.

Additionally, since the liquid crystal displays of this invention are low-cost and high-performance, they are optimum for full-color notebook PCs and all types of displays.

Additionally, since the electronic circuits of this invention are low-cost and high-performance, they will likely find wide acceptance.

I claim:

1. A fabrication process for fabricating a thin film semiconductor device, comprising:

forming an underlevel protection layer comprising an insulating material formed on at least a portion of a substrate;

forming a semiconductor film on the underlevel protection layer the semiconductor film being an active layer of a transistor; and melt crystallizing the semiconductor film, wherein a surface roughness of the underlevel protection layer has a center line mean roughness value of about 1.5 nm or less.

2. A fabrication process for fabricating a thin film semiconductor device using a single plasma enhanced chemical vapor deposition reactor, comprising:

removing films adhered in a deposition chamber of said plasma enhanced chemical vapor deposition reactor;

forming a passivation layer in said deposition chamber;

placing at least one substrate in said deposition chamber;

forming an underlevel protection layer on said in step 4, the at least one substrate;

forming a semiconductor layer on said underlevel protection layer; and removing said at least one substrate from said deposition chamber.

3. A fabrication process for fabricating a thin film semiconductor device, comprising forming an underlevel protection layer comprising an insulating material formed on at least a portion of each of a plurality of substrates;

placing the plurality of substrates in a deposition chamber of a low pressure chemical vapor deposition reactor, each of the plurality of substrates having a surface area S of about 90000 mm$^2$ or larger;

placing the plurality of substrates in the deposition chamber of the low pressure chemical vapor deposition reactor at a substrate spacing of d, where $d \geq 0.02 \times S^{1/2}$; and forming a semiconductor film on the underlevel protection layer, the semiconductor film being an active layer of a transistor.

4. A fabrication process for fabricating a thin film semiconductor devices comprising:

forming an underlevel protection layer comprising an insulating material formed on at least a portion of a substrate; and forming a silicon-containing semiconductor film on said underlevel protection layer, the silicon-containing semiconductor film being an active layer of a transistor, wherein the silicon-containing semiconductor film is formed with a low pressure chemical vapor deposition method using a higher silane as at least one type of source gas, the higher silane being $Si_nH_{2n+2}$, where n is an integer greater than or equal to 2 and wherein a deposition temperature of less than about 450° C. is used to form the silicon-containing semiconductor film, the silicon-containing semiconductor film being deposited at a deposition rate of about 0.20 nm/min or more.

5. A fabrication process as described in claim 4, wherein the silicon-containing semiconductor film is formed at a deposition rate of about 0.60 nm/min or more.

6. A fabrication process for fabricating a thin film semiconductor device having an underlevel protection layer formed on a portion of a substrate and a semiconductor film formed on said underlevel protection layer, the underlevel protection layer comprising an insulating material and the semiconductor film being an active layer of a transistor, the process comprising:

forming the semiconductor film on top of said underlevel protection layer in a plasma enhanced chemical vapor deposition reactor; and then exposing said semiconductor film to a hydrogen plasma without breaking a vacuum of the plasma enhanced chemical vapor deposition reactor.

7. A fabrication process for fabricating a thin film semiconductor device having an underlevel protection layer formed on at least a portion of a substrate and a semiconductor film formed on said underlevel protection layer, the underlevel protection layer comprising an insulating material and the semiconductor film being an active layer of a transistor, the process comprising;

forming the semiconductor film on top of said underlevel protection layer in a plasma enhanced chemical vapor deposition reactor, and then exposing said semiconductor film to an oxygen plasma without breaking a vacuum of the plasma enhanced chemical vapor deposition reactor.

8. A fabrication process for fabricating a thin film semiconductor device having an underlevel protection layer formed on at least a portion of a substrate and a semiconductor film formed on said underlevel protection layer, the underlevel protection layer comprising an insulating material and the semiconductor film being an active layer of a transistor, the process comprising:

forming the semiconductor film on top of said underlevel protection layer in a plasma enhanced chemical vapor deposition reactor; then exposing said semiconductor film to a hydrogen plasma without breaking a vacuum of the plasma enhanced chemical vapor deposition reactor, and then exposing said semiconductor film to an oxygen plasma without breaking the vacuum of the plasma enhanced chemical vapor deposition reactor.

9. A fabrication process for fabricating a thin film semiconductor device having an underlevel protection layer formed on at least a portion of a substrate and a semiconductor film formed on said underlevel protection layer, the underlevel protection layer comprising an insulating material and the semiconductor film being an active layer of a transistor, the processing comprising:

forming the semiconductor film on top of the underlevel protection layer; then removing an oxide layer from the surface of said semiconductor film and then melt crystallizing the semiconductor film immediately after the removal of the oxide layer.

10. A fabrication process for fabricating a thin film semiconductor device having a semiconductor film formed on an insulating material and the insulating material formed on at least a portion of a surface of a substrate, said semiconductor film being an active layer of a transistor the process comprising:

depositing the semiconductor film using a low pressure chemical vapor deposition at a deposition temperature less than about 450° C.;

irradiating said semiconductor film by one of optical and electromagnetic energy; and depositing a gate insulator layer after formation of said semiconductor film; wherein a deposition temperature of the gate insulator layer and a processing temperature following fabrication of the gate insulator layer are at or below 350° C.

11. A fabrication process as described in claim 10, wherein the deposition temperature of the semiconductor film is about 430° C. or less.

12. A fabrication process for fabricating a thin film semiconductor device having a semiconductor film formed on an insulating material and the insulating material formed on at least a portion of a surface of a substrate, said semiconductor film being an active layer of a transistor, the process comprising:

forming the semiconductor film at a deposition temperature of about 350° C. or less; irradiating said semiconductor film by one of optical and electromagnetic energy; and depositing a gate insulator layer after formation of said semiconductor film; wherein a deposition temperature of the gate insulator layer and a processing temperature following fabrication of the gate insulator layer are at or below 350° C.

13. A fabrication process as described in claim 12, wherein the semiconductor film is formed by plasma enhanced chemical vapor deposition.

14. A fabrication process as described in claim 12, wherein the semiconductor film is formed by sputtering.

15. A fabrication process for fabricating a thin film semiconductor device having a semiconductor film formed on an insulating material and the insulating material formed on at least a portion of a surface of a substrates, said semiconductor film being an active layer of a transistor, the process comprising:

fabricating the semiconductor film by very high frequency plasma enhanced chemical vapor deposition; and performing remaining processes at a maximum processing temperature of about 350° C. or less.

16. A fabrication process as described in claim 15, wherein a thickness of said semiconductor film is between about 20 nm and 150 nm.

17. A fabrication process as described in claim 15, wherein the fabricating step comprises:

using a chemical species containing constitutive elements of said semiconductor film for a source gas and a noble gas for a dilution gas.

18. A fabrication process as described in claim 17, wherein the chemical species containing the constitutive elements of the semiconductor film is a silane.

19. A fabrication process as described in claim 17 wherein the noble gas is helium.

20. A fabrication process as described in claim 17, wherein the noble gas is neon.

21. A fabrication process as described in claim 17 wherein the noble gas is argon.

22. A fabrication process for fabricating a thin film semiconductor device having a crystalline semiconductor film formed on an insulating material and the insulating material formed on at least a portion of a surface of a substrate, said crystalline semiconductor film being an active layer of a transistor, the process comprising:

fabricating the crystalline semiconductor film by microwave plasma enhanced chemical vapor deposition; and performing remaining processes at a maximum processing temperature of about 350° C. or less.

23. A fabrication process as described in claim 22, wherein a film thickness of said crystalline semiconductor film is between about 20 nm and 150 nm.

24. A fabrication process as described in claim 22, wherein a chemical species containing constitutive elements of said crystalline semiconductor film is used as a source gas and a noble gas is used as a dilution gas.

25. A fabrication process as described in claim 24, wherein the chemical species containing the constitutive elements of the crystalline semiconductor film is a silane.

26. A fabrication process as described in claim 24, wherein the noble gas is helium.

27. A fabrication process as described in claim 24, wherein the noble gas is neon.

28. A fabrication process as described in claim 24 wherein the noble gas is argon.

29. A fabrication process for fabricating a thin film semiconductor device having a semiconductor film formed on an insulating material and the insulating material formed on at least a portion of a surface of a substrate, said semiconductor film being an active layer of a transistor, the process comprising:

fabricating the semiconductor film by very high frequency plasma enhanced chemical vapor deposition;

crystallizing said semiconductor film; and performing remaining processes at a maximum processing temperature of about 350° C. or less.

30. A fabrication process as described in claim 29, wherein a film thickness of the semiconductor film is between about 10 nm and 150 nm.

31. A fabrication process as described in claim 29, wherein during the fabricating step, a chemical species containing constitutive elements of said crystalline semiconductor film is used as a source gas and a noble gas is used as a dilution gas.

32. A fabrication process as described in claim 31, wherein the chemical species containing the constitutive elements of the semiconductor film is a silane.

33. A fabrication process as described in claim 31, wherein the noble gas is helium.

34. A fabrication process as described in claim 31, wherein the noble gas is neon.

35. A fabrication process as described in claim 31, wherein the noble gas is argon.

36. A fabrication process for fabricating a thin film semiconductor device having a crystalline semiconductor film formed on an insulating material and the insulating material formed on at least a portion of a surface of a substrate, said crystalline semiconductor film being an active layer of a transistor the process comprising:

fabricating the crystalline semiconductor film by microwave plasma enhanced chemical vapor deposition; then crystallizing said semiconductor film; and performing remaining processes at a maximum processing temperature of about 350° C. or less.

37. A process as described in claim 36, wherein a film thickness of the crystalline semiconductor film is between about 10 nm and 150 nm.

38. A fabrication process as described in claim 36 wherein during the fabricating step a chemical specie containing a constitutive elements of said crystalline semiconductor film is used as a source gas and a noble gas is used as a dilution gas.

39. A fabrication process as described in claim 38 wherein the chemical specie containing the constitutive elements of the crystalline semiconductor film is a silane.

40. A fabrication process as described in claim 38 wherein the noble gas is helium.

41. A fabrication process as described in claim 38 wherein the noble gas is neon.

42. A fabrication process as described in claim 38, wherein the noble gas is argon.

* * * * *